(12) United States Patent
Toyota et al.

(10) Patent No.: US 11,322,660 B2
(45) Date of Patent: May 3, 2022

(54) PHOSPHOR AND SEMICONDUCTOR LIGHT EMITTING DEVICE USING THE SAME

(71) Applicant: Panasonic Intellectual Property Management Co., Ltd., Osaka (JP)

(72) Inventors: Kei Toyota, Osaka (JP); Shinnosuke Akiyama, Miyagi (JP); Riho Moriyama, Osaka (JP); Masato Mori, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 292 days.

(21) Appl. No.: 16/691,527

(22) Filed: Nov. 21, 2019

(65) Prior Publication Data

US 2020/0185571 A1   Jun. 11, 2020

(30) Foreign Application Priority Data

Dec. 6, 2018   (JP) .............................. JP2018-229409
Jan. 28, 2019  (JP) .............................. JP2019-012361

(51) Int. Cl.
*H01L 33/50* (2010.01)
*C09K 11/08* (2006.01)

(52) U.S. Cl.
CPC ........ *H01L 33/502* (2013.01); *C09K 11/0861* (2013.01)

(58) Field of Classification Search
CPC .............. H01L 33/502; C09K 11/0861; C09K 11/7774
See application file for complete search history.

(56) References Cited

U.S. PATENT DOCUMENTS

| | | | |
|---|---|---|---|
| 5,998,925 A | 12/1999 | Shimizu et al. | |
| 2013/0188333 A1 | 7/2013 | Ooya et al. | |
| 2015/0340573 A1* | 11/2015 | Yuan | C09K 11/025 438/27 |
| 2016/0003422 A1 | 1/2016 | Srivastava et al. | |
| 2019/0165218 A1* | 5/2019 | Nakai | H01L 25/0753 |

FOREIGN PATENT DOCUMENTS

| | | |
|---|---|---|
| JP | 10-242513 | 9/1998 |
| JP | 2900928 B | 6/1999 |
| JP | 2017-527639 | 9/2017 |
| WO | 2012/035729 | 3/2012 |
| WO | 2012/046642 | 4/2012 |

* cited by examiner

*Primary Examiner* — Jonathan Han

(74) *Attorney, Agent, or Firm* — Wenderoth, Lind & Ponack, L.L.P.

(57) ABSTRACT

A phosphor according to the present disclosure has excellent light emission properties in a blue-green region and high color rendering properties. The phosphor is represented by a chemical formula of $Lu_{(3-x-y-z)}Mg_xZn_yAl_5O_{12}:Ce_z$, in which when z is in a range of $0.01 \leq z \leq 0.03$, then $0 \leq x \leq 1.4$ and $0 \leq y \leq 1.4$, excluding x=0 and y=0; when z is in a range of is $0.03 < z \leq 0.06$, then y<0.2 and $0.1 \leq x \leq 1.4$, or x<0.2 and $0.1 \leq y \leq 1.4$, or x=0.2 and y=0.2; when z is in a range of $0.06 < z \leq 0.09$, then y<0.2 and $0.1 \leq x < 1.4$, or x<0.2 and $0.1 \leq y < 1.4$; and when z is in a range of $0.09 < z \leq 0.12$, then y<0.2 and $0.1 \leq x < 0.9$, or x<0.2 and $0.1 \leq y < 0.9$.

6 Claims, 18 Drawing Sheets

FIG. 5

TABLE 1

| FIG. 2A | | FIG. 2B | |
|---|---|---|---|
| 2θ/deg | RELATIVE INTENSITY | 2θ/deg | RELATIVE INTENSITY |
| 18.2 | 4401 | 18.1 | 1723 |
| 21.1 | 1494 | 21.0 | 368 |
| 28.0 | 3731 | 27.8 | 1517 |
| 30.0 | 1739 | 29.8 | 2391 |
| 33.6 | 10000 | 33.4 | 10000 |
| 36.9 | 2026 | 36.7 | 1916 |
| 41.5 | 2693 | 41.2 | 2326 |
| 42.9 | 604 | 42.7 | 424 |
| 47.0 | 2843 | 46.7 | 2233 |
| 52.0 | 579 | 52.9 | 1431 |
| 53.2 | 2035 | 53.2 | 0 |
| 55.6 | 3288 | 55.3 | 2588 |
| 56.7 | 1384 | 56.4 | 529 |
| 57.9 | 2352 | 57.6 | 2217 |
| 61.2 | 844 | 60.8 | 192 |
| 62.3 | 1173 | 61.9 | 792 |

FIG. 6

TABLE 2

$Lu_{3-x-y}Mg_xZn_yAl_5O_{12}:Ce_z$

| | x | y | z | BLENDING AMOUNT/g | | | | | | PEAK WAVELENGTH (nm) | Q | DETERIORATION | A/B | DETERIORATION | DETERIORATION COMPARISON |
|---|---|---|---|---|---|---|---|---|---|---|---|---|---|---|---|
| | | | | LUTETIUM OXIDE $Lu_2O_3$ | MAGNESIUM OXIDE MgO | ZINC OXIDE ZnO | ALUMINUM OXIDE $Al_2O_3$ | CERIUM OXIDE $CeO_2$ | BARIUM FLUORIDE $BaF_2$ | | | | | | |
| EXAMPLE 1 | 0.1 | 0 | 0.01 | 186.85 | 1.34 | 0.00 | 85.0 | 0.57 | 3.16 | 510 | 1.21 | E | 0.95 | E | E |
| EXAMPLE 2 | 0.4 | 0 | 0.01 | 167.5 | 5.4 | 0.0 | 85.0 | 0.6 | 3.0 | 501 | 1.22 | E | 0.96 | E | E |
| EXAMPLE 3 | 0.9 | 0 | 0.01 | 135.1 | 12.1 | 0.0 | 85.0 | 0.6 | 2.7 | 503 | 1.23 | E | 0.96 | E | E |
| EXAMPLE 4 | 1.4 | 0 | 0.01 | 102.8 | 18.8 | 0.0 | 85.0 | 0.6 | 2.4 | 505 | 1.2 | E | 0.96 | E | E |
| EXAMPLE 5 | 0 | 0.1 | 0.01 | 186.9 | 0.0 | 2.7 | 85.0 | 0.6 | 3.2 | 506 | 1.21 | E | 0.95 | E | E |
| EXAMPLE 6 | 0 | 0.4 | 0.01 | 167.5 | 0.0 | 10.9 | 85.0 | 0.6 | 3.1 | 512 | 1.21 | E | 0.96 | E | E |
| EXAMPLE 7 | 0 | 0.9 | 0.01 | 135.1 | 0.0 | 24.4 | 85.0 | 0.6 | 2.8 | 514 | 1.22 | E | 0.95 | E | E |
| EXAMPLE 8 | 0 | 1.4 | 0.01 | 102.8 | 0.0 | 38.0 | 85.0 | 0.6 | 2.6 | 510 | 1.22 | G | 0.95 | G | G |
| EXAMPLE 9 | 0.2 | 0.2 | 0.01 | 167.5 | 2.7 | 5.4 | 85.0 | 0.6 | 3.0 | 513 | 1.15 | E | 0.93 | G | G |
| EXAMPLE 10 | 0.2 | 0.9 | 0.01 | 122.2 | 2.7 | 24.4 | 85.0 | 0.6 | 2.7 | 514 | 1.19 | E | 0.94 | E | G |
| EXAMPLE 11 | 0.9 | 0.2 | 0.01 | 122.2 | 12.1 | 5.4 | 85.0 | 0.6 | 2.6 | 514 | 1.17 | E | 0.95 | E | E |
| EXAMPLE 12 | 0.4 | 1.4 | 0.01 | 76.9 | 5.4 | 38.0 | 85.0 | 0.6 | 2.4 | 520 | 1.18 | G | 0.94 | G | G |
| EXAMPLE 13 | 0.4 | 0.4 | 0.01 | 141.8 | 5.4 | 10.9 | 85.0 | 0.6 | 2.8 | 519 | 1.07 | G | 0.95 | E | E |
| EXAMPLE 14 | 1.4 | 0.4 | 0.01 | 76.9 | 18.8 | 10.9 | 85.0 | 0.6 | 2.2 | 518 | 1.06 | G | 0.95 | E | E |
| EXAMPLE 15 | 0.1 | 0 | 0.03 | 185.56 | 1.34 | 0.00 | 85.0 | 1.72 | 3.16 | 520 | 1.25 | E | 0.97 | E | E |
| EXAMPLE 16 | 0.4 | 0 | 0.03 | 166.2 | 5.4 | 0.0 | 85.0 | 1.7 | 3.0 | 505 | 1.25 | E | 0.96 | E | E |
| EXAMPLE 17 | 0.9 | 0 | 0.03 | 133.8 | 12.1 | 0.0 | 85.0 | 1.7 | 2.7 | 509 | 1.22 | E | 0.96 | E | E |
| EXAMPLE 18 | 1.4 | 0 | 0.03 | 101.5 | 18.8 | 0.0 | 85.0 | 1.7 | 2.4 | 520 | 1.22 | E | 0.95 | E | E |
| EXAMPLE 19 | 0 | 0.1 | 0.03 | 185.6 | 0.0 | 2.7 | 85.0 | 1.7 | 3.2 | 519 | 1.23 | E | 0.96 | E | E |
| EXAMPLE 20 | 0 | 0.4 | 0.03 | 166.2 | 0.0 | 10.9 | 85.0 | 1.7 | 3.1 | 503 | 1.2 | E | 0.96 | E | E |
| EXAMPLE 21 | 0 | 0.9 | 0.03 | 133.8 | 0.0 | 24.4 | 85.0 | 1.7 | 2.8 | 504 | 1.21 | E | 0.96 | E | E |
| EXAMPLE 22 | 0 | 1.4 | 0.03 | 101.5 | 0.0 | 38.0 | 85.0 | 1.7 | 2.6 | 519 | 1.21 | E | 0.95 | E | E |
| EXAMPLE 23 | 0.2 | 0.2 | 0.03 | 166.2 | 2.7 | 5.4 | 85.0 | 1.7 | 3.0 | 515 | 1.19 | E | 0.95 | E | E |
| EXAMPLE 24 | 0.2 | 0.9 | 0.03 | 120.9 | 2.7 | 24.4 | 85.0 | 1.7 | 2.7 | 520 | 1.16 | E | 0.96 | E | G |

FIG. 7

TABLE 3

| | $Lu_{1-x-y-z}M_yZr_zAl_5O_{12}:Ce_x$ | | | BLENDING AMOUNT(g) | | | | | | CERIUM OXIDE $CeO_2$ | BARIUM FLUORIDE $BaF_2$ | PEAK WAVELENGTH (nm) | C | DETERIORATION | A/B | DETERIORATION | COMPREHENSIVE EVALUATION |
|---|---|---|---|---|---|---|---|---|---|---|---|---|---|---|---|---|---|
| | x | y | z | | LUTETIUM OXIDE $Lu_2O_3$ | MAGNESIUM OXIDE MgO | ZINC OXIDE ZnO | ALUMINUM OXIDE $Al_2O_3$ | | | | | | | | | |
| EXAMPLE 26 | 0.9 | 0.2 | 0.03 | | 120.9 | 12.1 | 5.4 | 85.0 | | 1.7 | 2.6 | 517 | 1.09 | G | 0.96 | E | G |
| EXAMPLE 26 | 0.2 | 1.4 | 0.03 | | 75.8 | 5.4 | 38.0 | 85.0 | | 1.7 | 2.4 | 520 | 1.05 | G | 0.94 | G | G |
| EXAMPLE 27 | 0.4 | 0.4 | 0.03 | | 140.3 | 5.4 | 10.9 | 85.0 | | 1.7 | 2.8 | 517 | 1.07 | G | 0.95 | E | G |
| EXAMPLE 28 | 1.4 | 0.4 | 0.03 | | 75.8 | 18.8 | 10.9 | 85.0 | | 1.7 | 2.2 | 519 | 1.1 | G | 0.93 | G | G |
| EXAMPLE 29 | 0.1 | 0 | 0.06 | | 183.6 | 1.3 | 0.0 | 85.0 | | 3.4 | 3.2 | 515 | 1.15 | E | 0.94 | E | E |
| EXAMPLE 30 | 0.4 | 0 | 0.06 | | 164.2 | 5.4 | 0.0 | 85.0 | | 3.4 | 3.0 | 516 | 1.22 | E | 0.96 | G | G |
| EXAMPLE 31 | 0.9 | 0 | 0.06 | | 131.9 | 12.1 | 0.0 | 85.0 | | 3.4 | 2.7 | 515 | 1.23 | E | 0.94 | G | E |
| EXAMPLE 32 | 1.4 | 0 | 0.06 | | 99.6 | 18.8 | 0.0 | 85.0 | | 3.4 | 2.4 | 520 | 1.2 | E | 0.93 | G | G |
| EXAMPLE 33 | 0 | 0.1 | 0.06 | | 163.6 | 0.0 | 2.7 | 85.0 | | 3.4 | 3.2 | 514 | 1.18 | E | 0.96 | G | E |
| EXAMPLE 34 | 0 | 0.4 | 0.06 | | 164.2 | 0.0 | 10.9 | 85.0 | | 3.4 | 3.1 | 519 | 1.23 | E | 0.95 | E | E |
| EXAMPLE 35 | 0 | 0.9 | 0.06 | | 131.9 | 0.0 | 24.4 | 85.0 | | 3.4 | 2.9 | 517 | 1.23 | E | 0.94 | G | E |
| EXAMPLE 36 | 0 | 1.4 | 0.06 | | 99.6 | 0.0 | 38.0 | 85.0 | | 3.4 | 2.8 | 520 | 1.21 | P | 0.92 | G | P |
| EXAMPLE 37 | 0.2 | 0.2 | 0.06 | | 164.2 | 2.7 | 5.4 | 85.0 | | 3.4 | 3.0 | 516 | 1.16 | P | 0.93 | G | P |
| COMPARATIVE EXAMPLE 1 | 0.2 | 0.9 | 0.06 | | 119.9 | 2.7 | 24.4 | 85.0 | | 3.4 | 2.7 | 523 | - | P | 0.93 | G | P |
| COMPARATIVE EXAMPLE 2 | 0.9 | 0.2 | 0.06 | | 119.9 | 12.1 | 5.4 | 85.0 | | 3.4 | 2.6 | 546 | - | P | 0.92 | G | P |
| COMPARATIVE EXAMPLE 3 | 0.4 | 1.4 | 0.06 | | 73.7 | 5.4 | 38.0 | 85.0 | | 3.3 | 2.4 | 555 | - | P | 0.92 | G | P |
| COMPARATIVE EXAMPLE 4 | 0.4 | 0.4 | 0.06 | | 136.4 | 5.4 | 10.9 | 85.0 | | 3.4 | 2.8 | 549 | - | P | 0.94 | G | P |
| COMPARATIVE EXAMPLE 5 | 1.4 | 0.4 | 0.06 | | 73.7 | 18.8 | 10.9 | 85.0 | | 3.4 | 2.2 | 552 | 1.2 | E | 0.94 | G | G |
| EXAMPLE 38 | 0.1 | 0 | 0.09 | | 181.7 | 1.3 | 0.0 | 85.0 | | 5.2 | 3.2 | 515 | 1.08 | G | 0.91 | O | G |
| EXAMPLE 39 | 0.4 | 0 | 0.09 | | 162.3 | 5.4 | 0.0 | 85.0 | | 5.2 | 3.0 | 519 | 1.19 | G | 0.94 | O | G |
| EXAMPLE 40 | 0.9 | 0 | 0.09 | | 130.0 | 12.1 | 0.0 | 85.0 | | 5.2 | 2.7 | 524 | - | P | 0.93 | E | P |
| COMPARATIVE EXAMPLE 5 | 1.4 | 0 | 0.09 | | 97.6 | 18.8 | 0.0 | 85.0 | | 5.2 | 2.4 | 514 | 1.21 | E | 0.91 | G | G |
| EXAMPLE 41 | 0 | 0.1 | 0.09 | | 181.7 | 0.0 | 2.7 | 85.0 | | 5.2 | 3.2 | 515 | 1.09 | G | 0.95 | E | G |
| EXAMPLE 42 | 0 | 0.4 | 0.09 | | 162.3 | 0.0 | 10.9 | 85.0 | | 5.2 | 3.1 | | | | | | |

FIG. 8

TABLE 4

| | Lu₃₋ₓ₋ᵧMgₓZnᵧAl₅O₁₂:Ceₐ | | | BLENDING AMOUNTS | | | | | | PEAK WAVELENGTH (nm) | C | DETERMINATION | A/B | DETERMINATION | DETERMINATION OF TEMPERATURE DETERIORATION |
|---|---|---|---|---|---|---|---|---|---|---|---|---|---|---|---|
| | x | y | a | LUTETIUM OXIDE Lu₂O₃ | MAGNESIUM OXIDE MgO | ZINC OXIDE ZnO | ALUMINUM OXIDE Al₂O₃ | CERIUM OXIDE CeO₂ | BARIUM FLUORIDE BaF₂ | | | | | | |
| EXAMPLE 43 | 0 | 0.9 | 0.09 | 130.0 | 0.0 | 24.4 | 85.0 | 5.2 | 2.8 | 517 | 1.02 | G | 0.85 | E | G |
| COMPARATIVE EXAMPLE 7 | 0 | 1.4 | 0.09 | 97.6 | 0.0 | 38.0 | 85.0 | 5.2 | 2.6 | 520 | 1.01 | G | 0.91 | G | P |
| COMPARATIVE EXAMPLE 8 | 0.2 | 0.2 | 0.09 | 162.3 | 2.7 | 5.4 | 85.0 | 5.2 | 3.0 | 538 | - | P | 0.92 | G | P |
| EXAMPLE 9 | 0.2 | 0.9 | 0.09 | 117.0 | 2.7 | 24.4 | 85.0 | 5.2 | 2.7 | 544 | - | P | 0.91 | G | P |
| EXAMPLE 10 | 0.9 | 0.2 | 0.09 | 117.0 | 12.1 | 5.4 | 85.0 | 5.2 | 2.6 | 538 | - | P | 0.89 | P | P |
| COMPARATIVE EXAMPLE 9 | 0.4 | 1.4 | 0.09 | 71.8 | 5.4 | 38.0 | 85.0 | 5.2 | 2.4 | 536 | - | P | 0.9 | P | P |
| EXAMPLE 11 | 0.4 | 0.4 | 0.09 | 136.6 | 5.4 | 10.9 | 85.0 | 5.2 | 2.8 | 544 | - | P | 0.89 | P | P |
| COMPARATIVE EXAMPLE 12 | 1.4 | 0.4 | 0.09 | 71.8 | 18.8 | 10.9 | 85.0 | 5.2 | 2.2 | 545 | 1.1 | O | 0.89 | P | P |
| EXAMPLE 13 | 0.1 | 0 | 0.12 | 179.7 | 1.3 | 0.0 | 85.0 | 6.9 | 3.2 | 519 | 1.02 | O | 0.93 | G | O |
| EXAMPLE 44 | 0.4 | 0 | 0.12 | 160.3 | 5.4 | 0.0 | 85.0 | 6.9 | 3.0 | 520 | 1.05 | G | 0.92 | G | O |
| EXAMPLE 45 | 0.9 | 0 | 0.12 | 128.0 | 12.1 | 0.0 | 85.0 | 6.9 | 2.7 | 524 | - | O | 0.91 | G | O |
| EXAMPLE 14 | 1.4 | 0 | 0.12 | 95.7 | 18.8 | 0.0 | 85.0 | 6.9 | 2.4 | 531 | - | P | 0.93 | G | P |
| COMPARATIVE EXAMPLE 15 | 0 | 0.1 | 0.12 | 179.7 | 0.0 | 2.7 | 85.0 | 6.9 | 3.2 | 517 | 1.02 | O | 0.94 | G | O |
| EXAMPLE 46 | 0 | 0.4 | 0.12 | 160.3 | 0.0 | 10.9 | 85.0 | 6.9 | 3.1 | 519 | 1.05 | O | 0.91 | G | O |
| EXAMPLE 47 | 0 | 0.9 | 0.12 | 128.0 | 0.0 | 24.4 | 85.0 | 6.9 | 2.8 | 529 | - | P | 0.93 | G | P |
| EXAMPLE 16 | 0 | 1.4 | 0.12 | 95.7 | 0.0 | 38.0 | 85.0 | 6.9 | 2.6 | 530 | - | P | 0.93 | G | P |
| EXAMPLE 17 | 0.2 | 0.2 | 0.12 | 160.3 | 2.7 | 5.4 | 85.0 | 6.9 | 3.0 | 553 | - | P | 0.92 | G | P |
| EXAMPLE 18 | 0.2 | 0.9 | 0.12 | 115.1 | 2.7 | 24.4 | 85.0 | 6.9 | 2.7 | 555 | - | P | 0.92 | G | P |
| EXAMPLE 19 | 0.9 | 0.2 | 0.12 | 115.1 | 12.1 | 5.4 | 85.0 | 6.9 | 2.6 | 564 | - | P | 0.94 | G | P |
| EXAMPLE 20 | 0.2 | 1.4 | 0.12 | 69.8 | 2.7 | 38.0 | 85.0 | 6.9 | 2.4 | 566 | - | P | 0.89 | P | P |
| COMPARATIVE EXAMPLE 21 | 0.4 | 0.4 | 0.12 | 134.5 | 5.4 | 10.9 | 85.0 | 6.9 | 2.8 | 562 | - | P | 0.88 | P | P |
| COMPARATIVE EXAMPLE 22 | 1.4 | 0.4 | 0.12 | 69.8 | 18.8 | 10.9 | 85.0 | 6.9 | 2.2 | 563 | - | P | 0.89 | P | P |

FIG. 13

TABLE 5

| FIG. 10A | | FIG. 10B | |
|---|---|---|---|
| 2θ/deg | RELATIVE INTENSITY | 2θ/deg | RELATIVE INTENSITY |
| 18.3 | 4370 | 18.1 | 1723 |
| 21.1 | 1351 | 21.0 | 368 |
| 28.1 | 3388 | 27.8 | 1517 |
| 30.0 | 1652 | 29.8 | 2391 |
| 33.7 | 10000 | 33.4 | 10000 |
| 37.0 | 2028 | 36.7 | 1916 |
| 41.5 | 2591 | 41.2 | 2326 |
| 42.9 | 607 | 42.7 | 424 |
| 47.0 | 2745 | 46.7 | 2233 |
| 52.1 | 569 | 52.9 | 1431 |
| 53.3 | 1878 | 53.2 | 0 |
| 55.6 | 2986 | 55.3 | 2588 |
| 56.8 | 1237 | 56.4 | 529 |
| 57.9 | 2111 | 57.6 | 2217 |
| 61.2 | 757 | 60.8 | 192 |
| 62.3 | 1018 | 61.9 | 792 |

FIG. 14

TABLE 6

| | $Lu_{2-x-y-z}Mg_xZn_yAl_{5-v}O_{12}:Ce_v$ | | | LUTETIUM OXIDE $Lu_2O_3$ | BLENDING AMOUNT/g | | | | | PEAK WAVELENGTH (nm) | C | DETERMINATION | A/B | DETERMINATION | COMPREHENSIVE DETERMINATION |
|---|---|---|---|---|---|---|---|---|---|---|---|---|---|---|---|
| | x | y | z | | MAGNESIUM OXIDE MgO | ZINC OXIDE ZnO | ALUMINUM OXIDE $Al_2O_3$ | CERIUM OXIDE $CeO_2$ | BARIUM FLUORIDE $BaF_2$ | | | | | | |
| EXAMPLE 101 | 0.1 | 0 | 0.01 | 193.32 | 1.34 | 0.00 | 83.3 | 0.57 | 3.24 | 512 | 1.20 | E | 0.95 | E | E |
| EXAMPLE 102 | 0.4 | 0 | 0.01 | 193.3 | 5.4 | 0.0 | 78.2 | 0.6 | 3.2 | 502 | 1.23 | E | 0.95 | E | E |
| EXAMPLE 103 | 0.9 | 0 | 0.01 | 193.3 | 12.1 | 0.0 | 69.7 | 0.6 | 3.2 | 502 | 1.22 | E | 0.96 | E | E |
| EXAMPLE 104 | 1.4 | 0 | 0.01 | 193.3 | 18.8 | 0.0 | 61.2 | 0.6 | 3.2 | 505 | 1.21 | E | 0.95 | E | E |
| EXAMPLE 105 | 0 | 0.1 | 0.01 | 193.3 | 0.0 | 2.7 | 83.3 | 0.6 | 3.3 | 511 | 1.20 | E | 0.95 | E | E |
| EXAMPLE 106 | 0 | 0.4 | 0.01 | 193.3 | 0.0 | 10.9 | 78.2 | 0.6 | 3.3 | 507 | 1.22 | E | 0.95 | E | E |
| EXAMPLE 107 | 0 | 0.9 | 0.01 | 193.3 | 0.0 | 24.4 | 69.7 | 0.6 | 3.3 | 509 | 1.21 | E | 0.96 | E | E |
| EXAMPLE 108 | 0 | 1.4 | 0.01 | 193.3 | 0.0 | 38.0 | 61.2 | 0.6 | 3.4 | 511 | 1.22 | E | 0.95 | E | E |
| EXAMPLE 109 | 0.2 | 0.2 | 0.01 | 193.3 | 2.7 | 5.4 | 78.2 | 0.6 | 3.3 | 510 | 1.19 | E | 0.93 | G | G |
| EXAMPLE 1010 | 0.2 | 0.9 | 0.01 | 193.3 | 2.7 | 24.4 | 66.3 | 0.6 | 3.3 | 513 | 1.17 | G | 0.94 | G | G |
| EXAMPLE 1011 | 0.9 | 0.2 | 0.01 | 193.3 | 12.1 | 5.4 | 66.3 | 0.6 | 3.2 | 517 | 1.18 | G | 0.96 | G | G |
| EXAMPLE 1012 | 0.4 | 1.4 | 0.01 | 193.3 | 5.4 | 38.0 | 54.4 | 0.6 | 3.4 | 518 | 1.16 | G | 0.93 | G | G |
| EXAMPLE 1013 | 0.4 | 0.4 | 0.01 | 193.3 | 5.4 | 10.9 | 71.4 | 0.6 | 3.3 | 518 | 1.05 | G | 0.95 | G | G |
| EXAMPLE 1014 | 1.4 | 0.4 | 0.01 | 193.3 | 18.8 | 10.9 | 54.4 | 0.6 | 3.2 | 517 | 1.05 | G | 0.95 | G | G |
| EXAMPLE 1015 | 0.1 | 0 | 0.03 | 192.03 | 1.34 | 0.00 | 83.3 | 1.72 | 3.23 | 508 | 1.23 | E | 0.95 | E | E |
| EXAMPLE 1016 | 0.4 | 0 | 0.03 | 192.0 | 5.4 | 0.0 | 78.2 | 1.7 | 3.2 | 510 | 1.24 | E | 0.95 | E | E |
| EXAMPLE 1017 | 0.9 | 0 | 0.03 | 192.0 | 12.1 | 0.0 | 69.7 | 1.7 | 3.2 | 509 | 1.22 | E | 0.96 | E | E |
| EXAMPLE 1018 | 1.4 | 0 | 0.03 | 192.0 | 18.8 | 0.0 | 61.2 | 1.7 | 3.2 | 520 | 1.22 | E | 0.95 | E | E |
| EXAMPLE 1019 | 0 | 0.1 | 0.03 | 192.0 | 0.0 | 2.7 | 83.3 | 1.7 | 3.3 | 518 | 1.22 | E | 0.96 | E | E |
| EXAMPLE 1020 | 0 | 0.4 | 0.03 | 192.0 | 0.0 | 10.9 | 78.2 | 1.7 | 3.3 | 505 | 1.21 | E | 0.97 | E | E |
| EXAMPLE 1021 | 0 | 0.9 | 0.03 | 192.0 | 0.0 | 24.4 | 69.7 | 1.7 | 3.3 | 506 | 1.20 | E | 0.95 | E | E |
| EXAMPLE 1022 | 0 | 1.4 | 0.03 | 192.0 | 0.0 | 38.0 | 61.2 | 1.7 | 3.4 | 515 | 1.22 | E | 0.96 | E | E |
| EXAMPLE 1023 | 0.2 | 0.2 | 0.03 | 192.0 | 2.7 | 5.4 | 78.2 | 1.7 | 3.3 | 514 | 1.19 | G | 0.95 | G | G |
| EXAMPLE 1024 | 0.2 | 0.9 | 0.03 | 192.0 | 2.7 | 24.4 | 66.3 | 1.7 | 3.3 | 520 | 1.18 | G | 0.97 | E | G |

FIG. 15

TABLE 7

$Lu_{3-x-y-z}Me_xAl_{5-y}O_{12}:Pr_yCe_z$

| | x | y | z | BLENDING AMOUNT/g | | | | | | PEAK WAVELENGTH (nm) | C | DETERMINATION | A/B | DETERMINATION | COMPREHENSIVE DETERMINATION |
|---|---|---|---|---|---|---|---|---|---|---|---|---|---|---|---|
| | | | | LUTETIUM OXIDE $Lu_2O_3$ | MAGNESIUM OXIDE MgO | ZINC OXIDE ZnO | ALUMINUM OXIDE $Al_2O_3$ | CERIUM OXIDE $Ce_2O_3$ | BARIUM FLUORIDE $BaF_2$ | | | | | | |
| EXAMPLE 1025 | 0.9 | 0.2 | 0.03 | 192.0 | 12.1 | 5.4 | 66.3 | 1.7 | 3.2 | 517 | 1.09 | G | 0.96 | E | G |
| EXAMPLE 1026 | 0.4 | 1.4 | 0.03 | 192.0 | 5.4 | 38.0 | 54.4 | 1.7 | 3.4 | 519 | 1.05 | G | 0.92 | G | G |
| EXAMPLE 1027 | 0.4 | 0.4 | 0.03 | 192.0 | 5.4 | 10.9 | 71.4 | 1.7 | 3.3 | 514 | 1.02 | G | 0.95 | E | G |
| EXAMPLE 1028 | 1.4 | 0.4 | 0.03 | 192.0 | 18.8 | 10.9 | 54.4 | 1.7 | 3.2 | 516 | 1.1 | G | 0.94 | E | G |
| EXAMPLE 1029 | 0.1 | 0 | 0.06 | 190.1 | 1.3 | 0.0 | 83.3 | 3.4 | 3.2 | 514 | 1.14 | G | 0.93 | E | E |
| EXAMPLE 1030 | 0.4 | 0 | 0.06 | 190.1 | 5.4 | 0.0 | 78.2 | 3.4 | 3.2 | 511 | 1.21 | E | 0.95 | C | E |
| EXAMPLE 1031 | 0.9 | 0 | 0.06 | 190.1 | 12.1 | 0.0 | 69.7 | 3.4 | 3.2 | 515 | 1.23 | E | 0.94 | G | G |
| EXAMPLE 1032 | 1.4 | 0 | 0.06 | 190.1 | 18.8 | 0.0 | 61.2 | 3.4 | 3.2 | 518 | 1.21 | E | 0.95 | G | E |
| EXAMPLE 1033 | 0 | 0.1 | 0.06 | 190.1 | 0.0 | 2.7 | 83.3 | 3.4 | 3.3 | 514 | 1.16 | G | 0.95 | E | G |
| EXAMPLE 1034 | 0 | 0.4 | 0.06 | 190.1 | 0.0 | 10.9 | 78.2 | 3.4 | 3.2 | 511 | 1.22 | E | 0.92 | G | E |
| EXAMPLE 1035 | 0 | 0.9 | 0.06 | 190.1 | 0.0 | 24.4 | 69.7 | 3.4 | 3.3 | 516 | 1.23 | E | 0.94 | E | G |
| EXAMPLE 1036 | 0 | 1.4 | 0.06 | 190.1 | 0.0 | 38.0 | 61.2 | 3.4 | 3.4 | 520 | 1.2 | G | 0.93 | G | G |
| EXAMPLE 1037 | 0.2 | 0.2 | 0.06 | 190.1 | 2.7 | 5.4 | 78.2 | 3.4 | 3.3 | 517 | 1.15 | G | 0.94 | G | G |
| COMPARATIVE EXAMPLE 101 | 0.2 | 0.9 | 0.06 | 190.1 | 2.7 | 24.4 | 66.3 | 3.4 | 3.3 | 521 | - | P | 0.94 | G | P |
| COMPARATIVE EXAMPLE 102 | 0.9 | 0.2 | 0.06 | 190.1 | 12.1 | 5.4 | 66.3 | 3.4 | 3.2 | 545 | - | P | 0.95 | G | P |
| COMPARATIVE EXAMPLE 103 | 0.4 | 1.4 | 0.06 | 190.1 | 5.4 | 38.0 | 54.4 | 3.4 | 3.4 | 550 | - | P | 0.93 | G | P |
| COMPARATIVE EXAMPLE 104 | 0.4 | 0.4 | 0.06 | 190.1 | 5.4 | 10.9 | 71.4 | 3.4 | 3.4 | 542 | - | P | 0.93 | G | G |
| EXAMPLE 1038 | 0.4 | 0.4 | 0.06 | 190.1 | 5.4 | 10.9 | 54.4 | 3.4 | 3.2 | 551 | 1.21 | E | 0.9 | E | G |
| EXAMPLE 1039 | 0.1 | 0 | 0.09 | 188.1 | 1.3 | 0.0 | 83.3 | 5.2 | 3.2 | 513 | 1.08 | G | 0.93 | G | G |
| EXAMPLE 1039 | 0.4 | 0 | 0.09 | 188.1 | 5.4 | 0.0 | 78.2 | 5.2 | 3.2 | 529 | 1.19 | P | 0.95 | G | G |
| COMPARATIVE EXAMPLE 105 | 0.9 | 0 | 0.09 | 188.1 | 12.1 | 0.0 | 69.7 | 5.2 | 3.2 | 519 | - | P | 0.94 | E | P |
| EXAMPLE 1040 | 1.4 | 0 | 0.09 | 188.1 | 18.8 | 0.0 | 61.2 | 5.2 | 3.2 | 524 | 1.2 | P | 0.93 | G | G |
| EXAMPLE 1041 | 0 | 0.1 | 0.09 | 188.1 | 0.0 | 2.7 | 83.3 | 5.2 | 3.2 | 515 | 1.2 | E | 0.95 | E | G |
| EXAMPLE 1042 | 0 | 0.4 | 0.09 | 188.1 | 0.0 | 10.9 | 78.2 | 5.2 | 3.3 | 513 | 1.08 | G | 0.95 | G | G |

FIG. 16

TABLE 8

| | $La_{3-x-y}Mg_xZn_yAl_{5-x}$ $O_{12}:Ce$ | | | BLENDING AMOUNTS | | | | | | PEAK WAVELENGTH (nm) | C | DETERMINATION | A/B | DETERMINATION | COMPRESSION STRENGTH |
|---|---|---|---|---|---|---|---|---|---|---|---|---|---|---|---|
| | x | y | x | Lutetium oxide $Lu_2O_3$ | Magnesium oxide MgO | Zinc oxide ZnO | Aluminum oxide $Al_2O_3$ | Cerium oxide $Ce_2O_3$ | Barium fluoride $BaF_2$ | | | | | | |
| EXAMPLE 1003 | 0 | 0.9 | 0.09 | 188.1 | 0.0 | 24.4 | 69.7 | 5.2 | 3.3 | 515 | 1.01 | G | 0.96 | E | G |
| COMPARATIVE EXAMPLE 107 | 0 | 1.4 | 0.09 | 188.1 | 0.0 | 38.0 | 61.2 | 5.2 | 3.4 | 518 | 1.02 | G | 0.94 | G | G |
| EXAMPLE 108 | 0.2 | 0.2 | 0.09 | 188.1 | 2.7 | 5.4 | 78.2 | 5.2 | 3.2 | 530 | - | P | 0.91 | G | P |
| COMPARATIVE EXAMPLE 109 | 0.2 | 0.9 | 0.09 | 188.1 | 2.7 | 24.4 | 66.3 | 5.2 | 3.3 | 545 | - | P | 0.92 | G | P |
| COMPARATIVE EXAMPLE 1010 | 0.9 | 0.2 | 0.09 | 188.1 | 12.1 | 5.4 | 66.3 | 5.2 | 3.2 | 539 | - | P | 0.88 | P | P |
| EXAMPLE 1011 | 0.4 | 1.4 | 0.09 | 188.1 | 5.4 | 38.0 | 54.4 | 5.2 | 3.4 | 551 | - | P | 0.91 | P | P |
| COMPARATIVE EXAMPLE 1012 | 0.4 | 0.4 | 0.09 | 188.1 | 5.4 | 10.9 | 71.4 | 5.2 | 3.3 | 543 | - | P | 0.87 | P | P |
| EXAMPLE 1013 | 1.4 | 0.4 | 0.09 | 188.1 | 18.8 | 10.9 | 54.4 | 5.2 | 3.2 | 531 | - | P | 0.89 | P | P |
| EXAMPLE 1014 | 0.1 | 0 | 0.12 | 186.2 | 1.3 | 0.0 | 83.3 | 6.9 | 3.2 | 518 | 1.1 | G | 0.92 | G | G |
| EXAMPLE 1015 | 0.4 | 0 | 0.12 | 186.2 | 5.4 | 0.0 | 78.2 | 6.9 | 3.2 | 520 | 1.02 | G | 0.94 | G | G |
| COMPARATIVE EXAMPLE 1016 | 0.9 | 0 | 0.12 | 186.2 | 12.1 | 0.0 | 69.7 | 6.9 | 3.2 | 524 | - | P | 0.94 | P | P |
| COMPARATIVE EXAMPLE 1015 | 1.4 | 0 | 0.12 | 186.2 | 18.8 | 0.0 | 61.2 | 6.9 | 3.4 | 531 | - | P | 0.93 | P | P |
| EXAMPLE 1017 | 0 | 0.1 | 0.12 | 186.2 | 0.0 | 2.7 | 83.3 | 6.9 | 3.2 | 515 | 1.02 | G | 0.94 | G | G |
| EXAMPLE 1018 | 0 | 0.4 | 0.12 | 186.2 | 0.0 | 10.9 | 78.2 | 6.9 | 3.3 | 516 | 1.05 | G | 0.9 | G | P |
| COMPARATIVE EXAMPLE 1019 | 0 | 0.9 | 0.12 | 186.2 | 0.0 | 24.4 | 69.7 | 6.9 | 3.3 | 529 | - | P | 0.93 | P | P |
| EXAMPLE 1020 | 0 | 1.4 | 0.12 | 186.2 | 0.0 | 38.0 | 61.2 | 6.9 | 3.4 | 530 | - | P | 0.94 | G | P |
| COMPARATIVE EXAMPLE 1020 | 0.2 | 0.2 | 0.12 | 186.2 | 2.7 | 5.4 | 78.2 | 6.9 | 3.2 | 553 | - | P | 0.93 | P | P |
| EXAMPLE 1021 | 0.2 | 0.9 | 0.12 | 186.2 | 2.7 | 24.4 | 66.3 | 6.9 | 3.3 | 555 | - | P | 0.93 | P | P |
| EXAMPLE 1022 | 0.9 | 0.2 | 0.12 | 186.2 | 12.1 | 5.4 | 66.3 | 6.9 | 3.2 | 564 | - | P | 0.88 | G | P |
| COMPARATIVE EXAMPLE 1022 | 0.4 | 1.4 | 0.12 | 186.2 | 5.4 | 38.0 | 54.4 | 6.9 | 3.4 | 566 | - | P | 0.87 | P | P |
| EXAMPLE 1023 | 0.4 | 0.4 | 0.12 | 186.2 | 5.4 | 10.9 | 71.4 | 6.9 | 3.3 | 563 | - | P | 0.87 | P | P |
| COMPARATIVE EXAMPLE 1023 | 1.4 | 0.4 | 0.12 | 186.2 | 18.8 | 10.9 | 54.4 | 6.9 | 3.2 | 563 | - | P | 0.89 | P | P |

PHOSPHOR AND SEMICONDUCTOR LIGHT EMITTING DEVICE USING THE SAME

TECHNICAL FIELD

The technical field relates to a phosphor that absorbs a bluish excitation light and emits blue-greenish fluorescence. In particular, the present disclosure relates to a phosphor that is suitably used for imparting color rendering properties to a light source for illumination. In addition, the present disclosure relates to a semiconductor light emitting device for a white light source using the phosphor.

BACKGROUND

As a technique for obtaining a white light source, for example, there has been known a technique in which a phosphor such as YAG:Ce, which is excited by ultraviolet light or blue light emitted from a semiconductor light emitting element represented by a gallium nitride (GaN)-based blue light emitting diode and emits yellowish fluorescence having a longer wavelength, is used to obtain white light by combining unabsorbed excitation light with the yellowish fluorescence (for example, see Patent Literature 1: U.S. Pat. No. 2,900,928). Since having a long service life and low power consumption, such a semiconductor light emitting device for a white light source is becoming mainstream as an image display device and a light source for illumination.

However, the white light, which is formed of the yellowish fluorescence and the blue light that serves as a complementary color and that is not absorbed, may be lacking in color rendering properties. For example, blue-green light or green light having a wavelength between that of the blue light that is the excitation light and that of the yellow light that is the fluorescence, is insufficient. In order to make up for the insufficient color rendering properties, various phosphors have been proposed so far, such as a cerium-activated calcium sulfide (CaS: Ce) phosphor, which is an alkaline earth metal sulfide having a rock salt crystal structure, a phosphor of $(Sr, Ba)_2SiO_4: Eu^{2+}$, which is an alkaline earth metal orthosilicate having divalent europium activated, a phosphor of $(Y, Sm)_3(Al, Ga)_5O_{12}:Ce$, which is obtained by substituting a part of aluminum with Ga, in a known YAG:Ce phosphor obtained by having cerium activated in yttrium aluminum garnet (for example, see Patent Literature 2: JP-A-10-242513), or a phosphor obtained by substituting a part of yttrium with Lu, in the YAG:Ce phosphor (for example, see Patent Literature 3: WO2012/046642).

SUMMARY

However, for example, when a high output excitation light such as a blue laser is applied as an excitation light to implement a high luminance light source, it may be difficult for these phosphors to deal with problems in aspects of chemical stability, light emission luminance, or light emission luminance at a high temperature. In addition, even when the light emission luminance at a high temperature is sufficient, a blue-green light emitting component may be insufficient.

In the future, there will be an increasing demand for a phosphor that has a shorter light emission peak wavelength and is closer to blue, due to market needs of a high color rendering light source in high luminance light sources and laser excitation projectors. In addition, the light emission luminance is required to be less decreased at a high temperature.

In order to solve the above problems, an object of the present disclosure is to provide a phosphor that is suitable for a blue excitation light source with low decrease in light emission luminance at a high temperature.

A phosphor according to a first aspect of the present disclosure is represented by a chemical formula of $Lu_{(3-x-y-z)}Mg_xZn_yAl_5O_{12}:Ce_z$, in which
when z is in a range of $0.01 \leq z \leq 0.03$, then $0 \leq x \leq 1.4$ and $0 \leq y \leq 1.4$, excluding x=0 and y=0;
when z is in a range of $0.03 < z \leq 0.06$, then $y<0.2$ and $0.1 \leq x \leq 1.4$, or $x<0.2$ and $0.1 \leq y \leq 1.4$, or x=0.2 and y=0.2;
when z is in a range of $0.06 < z \leq 0.09$, then $y<0.2$ and $0.1 \leq x<1.4$, or $x<0.2$ and $0.1 \leq y<1.4$; and
when z is in a range of $0.09 < z \leq 0.12$, then $y<0.2$ and $0.1 \leq x<0.9$, or $x<0.2$ and $0.1 \leq y<0.9$.

A phosphor according to a second aspect of the present disclosure is represented by a chemical formula of $Lu_{(3-z)}Mg_xZn_yAl_{(5-x-y)}O_{12}:Ce_z$, in which
when z is in a range of $0.01 \leq z \leq 0.03$, then $0 \leq x \leq 1.4$ and $0 \leq y \leq 1.4$, excluding x=0 and y=0;
when z is in a range of $0.03 < z \leq 0.06$, then $y<0.2$ and $0.1 \leq x \leq 1.4$, or $x<0.2$ and $0.1 \leq y \leq 1.4$, or x=0.2 and y=0.2;
when z is in a range of $0.06 < z \leq 0.09$, then $y<0.2$ and $0.1 \leq x<1.4$, or $x<0.2$ and $0.1 \leq y<1.4$; and when z is in a range of $0.09 < z \leq 0.12$, then $y<0.2$ and $0.1 \leq x<0.9$, or $x<0.2$ and $0.1 \leq y<0.9$.

The phosphors according to the first and second aspects of the present disclosure have a light emission peak wavelength of 500 nm or more and 520 nm or less, exhibit high color rendering properties in a short wavelength region within a visible wavelength region, and have low decrease in light emission luminance or light emission luminance at a high temperature. Therefore, it is possible to obtain an excellent semiconductor light emitting device for a white light source with high color rendering and low luminance decrease at a high temperature by combining the phosphors with, for example, a semiconductor light emitting device that emits blue light and has a light emission peak wavelength of 450 nm.

BRIEF DESCRIPTION OF THE DRAWINGS

FIG. 5 is Table 1 illustrating positions of main peaks and relative intensity of peak positions of the X-ray diffraction profiles in FIGS. 2A and 2B.

FIG. 6 is Table 2 illustrating blending amounts and evaluation results of Examples 1 to 24.

FIG. 7 is Table 3 illustrating blending amounts and evaluation results of Examples 25 to 42 and Comparative Examples 1 to 6.

FIG. 8 is Table 4 illustrating blending amounts and evaluation results of Examples 43 to 47 and Comparative Examples 7 to 23.

FIG. 13 is Table 5 illustrating positions of main peaks and relative intensity of peak positions of the X-ray diffraction profiles in FIGS. 10A and 10B.

FIG. 14 is Table 6 illustrating blending amounts and evaluation results of Examples 101 to 1024.

FIG. 15 is Table 7 illustrating blending amounts and evaluation results of Examples 1025 to 1042 and Comparative Examples 101 to 106.

FIG. 16 is Table 8 illustrating blending amounts and evaluation results of Examples 1043 to 1047 and Comparative Examples 107 to 1023.

DESCRIPTION OF EMBODIMENTS

Figure 1:
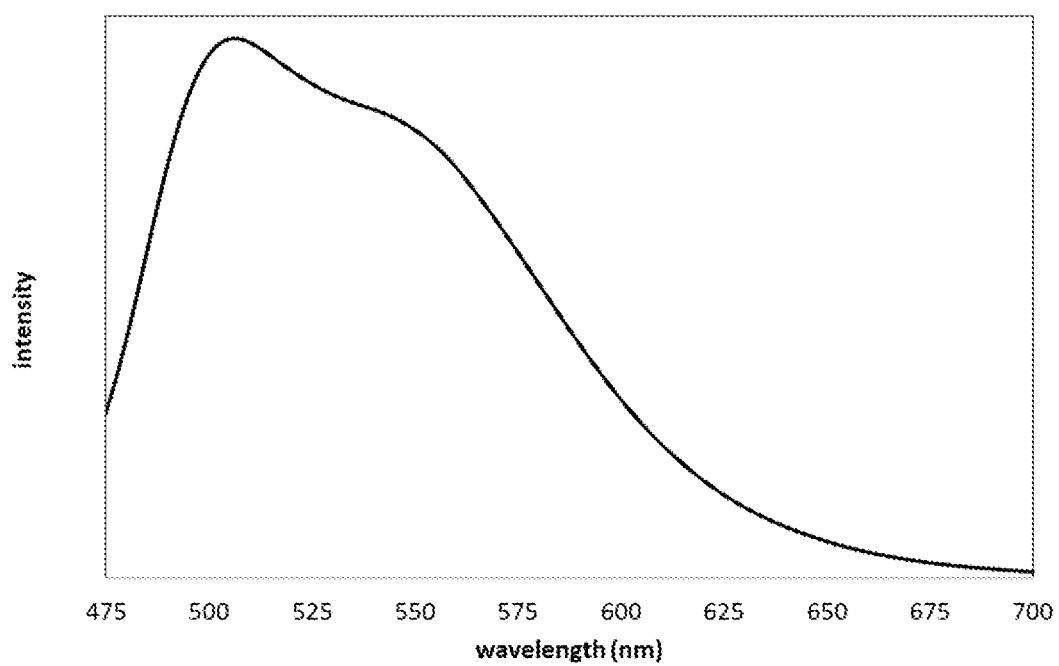
FIG. 1 illustrates a fluorescence spectrum of an example (for example, Example 15) of a phosphor according to a first embodiment.

Hereinafter, phosphors according to embodiments and semiconductor light emitting elements using the phosphors will be described with reference to the accompanying drawings. In the drawings, substantially the same components are denoted by the same reference numerals.

First Embodiment

A phosphor according to the present disclosure is represented by a chemical formula of $Lu_{(3-x-y-z)}Mg_xZn_yAl_5O_{12}$:$Ce_z$, in which when z is in a range of $0.01 \leq z \leq 0.03$, then $0 \leq x \leq 1.4$ and $0 \leq y \leq 1.4$, excluding $x=0$ and $y=0$;

when z is in a range of $0.03 < z \leq 0.06$, then $y < 0.2$ and $0.1 \leq x \leq 1.4$, or $x < 0.2$ and $0.1 \leq y \leq 1.4$, or $x=0.2$ and $y=0.2$;

when z is in a range of $0.06 < z \leq 0.09$, then $y < 0.2$ and $0.1 \leq x < 1.4$, or $x < 0.2$ and $0.1 \leq y < 1.4$; and when z is in a range of $0.09 < z \leq 0.12$, then $y < 0.2$ and $0.1 \leq x < 0.9$, or $x < 0.2$ and $0.1 \leq y < 0.9$.

In the chemical formula of the phosphor according to the present disclosure, when z is in a range of $0.01 \leq z \leq 0.03$, then $y < 0.2$ and $0.1 \leq x \leq 1.4$, or $x < 0.2$ and $0.1 \leq y \leq 1.4$, and when z is in a range of $0.03 < z \leq 0.06$, then $y < 0.2$ and $0.1 < x < 0.9$, or $x < 0.2$ and $0.1 < y < 0.9$.

A light emitting device according to the present disclosure includes the phosphor, and a semiconductor light emitting device having a light emission peak wavelength of 450 nm.

With the configuration described above, it is possible to provide an efficient semiconductor light emitting device for a white light source with excellent color rendering properties and low luminance decrease at high output for having low luminance decrease at a high temperature.

<Phosphor>

Figure 2A:
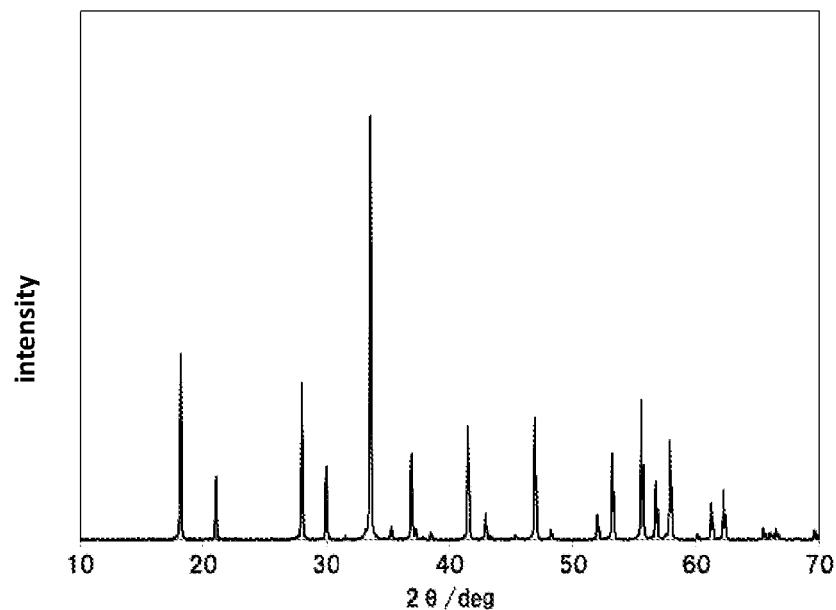
FIG. 2A illustrates a powder X-ray diffraction profile of the example (for example, Example 15) of the phosphor according to the first embodiment.

FIG. 1 illustrates a fluorescence spectrum of an example (for example, Example 15) of the phosphor according to the first embodiment. FIG. 2A illustrates a powder X-ray diffraction profile of the example (for example, Example 15) of the phosphor according to the first embodiment.

The phosphor according to the first embodiment is represented by a chemical formula of $Lu_{(3-x-y-z)}Mg_xZn_yAl_5O_{12}$:$Ce_z$. The phosphor contains $Lu_3Al_5O_{12}$ as a matrix crystal which has a garnet structure, contains Mg or Zn as a metal element that substitutes Lu, and contains Ce as a light emission center element. The contents of Mg, Zn, and Ce are respectively indicated by indices x, y, and z. Ranges of each index are shown for the following four cases, with respect to ranges of the index z indicating the content of Ce.

i) When z is in a range of $0.01 \leq z \leq 0.03$, then $0 \leq x \leq 1.4$ and $0 \leq y \leq 1.4$, excluding $x=0$ and $y=0$.

ii) When z is in a range of $0.03 < z \leq 0.06$, then $y < 0.2$ and $0.1 \leq x \leq 1.4$, or $x < 0.2$ and $0.1 \leq y \leq 1.4$, or $x=0.2$ and $y=0.2$.

iii) When z is in a range of $0.06 < z \leq 0.09$, then $y < 0.2$ and $0.1 \leq x < 1.4$, or $x < 0.2$ and $0.1 \leq y < 1.4$.

iv) When z is in a range of $0.09 < z \leq 0.12$, then $y < 0.2$ and $0.1 \leq x < 0.9$, or $x < 0.2$ and $0.1 \leq y < 0.9$.

As illustrated in the fluorescence spectrum of FIG. 1, the phosphor has a light emission peak wavelength of 500 nm or more and 520 nm or less, exhibits high color rendering properties in a short wavelength region within a visible wavelength region, and shows low decrease in light emission luminance or light emission luminance at a high temperature. Therefore, it is possible to obtain an excellent semiconductor light emitting device for a white light source with high color rendering and low luminance decrease at a high temperature by combining the phosphor with, for example, a semiconductor light emitting device that emits blue light and has a light emission peak wavelength of 450 nm.

<Method for Producing Phosphor>

Hereinafter, each step of a method for producing the phosphor according to the first embodiment will be described. (1) As raw materials, oxides, for example, of lutetium (Lu), aluminum (Al), magnesium (Mg), and zinc (Zn), which are elements constituting a matrix crystal, can be used. As the oxides of the raw materials, lutetium oxide, alumina, magnesium oxide, and zinc oxide are prepared, and further a cerium oxide is prepared as a raw material of cerium (Ce) serving as an activator. It should be noted that at least one of magnesium oxide and zinc oxide may be prepared, or both may be prepared. In addition, the raw materials can also be metal salt compounds including carbonates and the like, instead of the oxides. (2) Predetermined amounts of powders of the raw materials are weighed and thoroughly mixed. For example, a mixing device such as a ball mill can be used for mixing the powders, or the powders can be mixed manually using a mortar or the like. Barium fluoride ($BaF_2$) or strontium fluoride ($SrF_2$) as a flux corresponding to 0.1 weight % to 10 weight % of the mixed powder can be mixed.

Although the mixed powder is obtained by dry mixing as described above, the mixing is not limited thereto, and may be wet mixing. Further, the mixed powder of the raw materials may be obtained by a precipitation reaction, a sol-gel method, or the like.

(3) Next, the mixed powder prepared as described above is calcined. For example, an electric furnace can be used for calcining the mixed powder. The mixed powder is put into, for example, a crucible made of alumina, and is heated together with the alumina crucible at 1200° C. or higher and 1600° C. or lower for about 3 hours or more and 12 hours or less for calcining. (4) After the calcining, the mixed powder is subjected to steps such as cooling, crushing, or fluxing with an acid as required to obtain the phosphor powder.

<Semiconductor Light Emitting Device for White Light Source>

Figure 3:
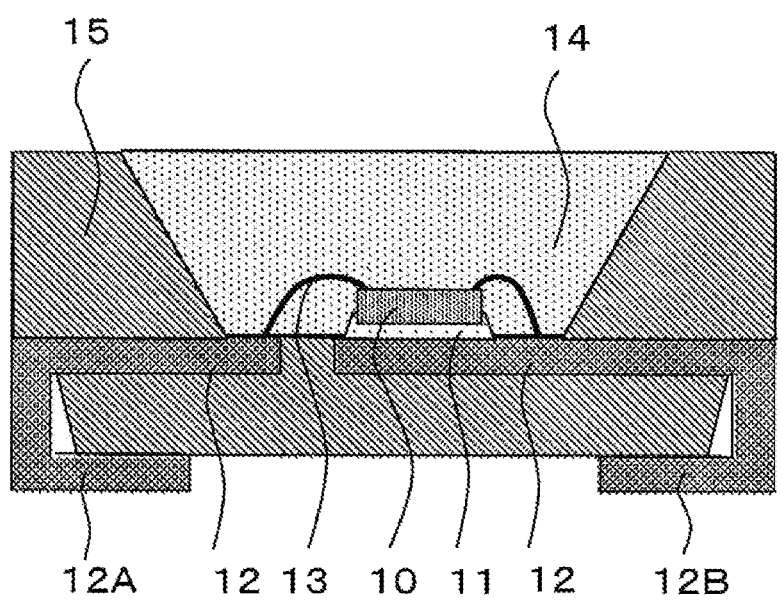
FIG. 3 is a schematic cross-sectional view illustrating an example (for example, Example 48) of a semiconductor light emitting device for a white light source which uses the phosphor according to the first embodiment.

FIG. 3 is a schematic cross-sectional view illustrating a structure of the semiconductor light emitting device for a white light source according to the first embodiment. The semiconductor light emitting device for a white light source includes: a lead frame 12 that at least includes lead parts 12A and 12B; a resin container 15 that includes a recessed part; a semiconductor element 10 that is disposed on an inner side of the resin container 15 and that is mounted on the lead part 12B via a publicly known die bonding material 11; a metal wire 13 that electrically connects the semiconductor element 10 and the lead parts 12A and 12B; and a phosphor-containing sealing resin 14.

Hereinafter, members constituting the semiconductor light emitting device for a white light source will be described.

<Semiconductor Element>

The semiconductor element 10 is bonded by the paste material 11 so as to be mounted on the lead part 12B at a portion located on a bottom surface of the recessed part of the resin container 15. Further, a p-type electrode is connected to the lead part 12A used for an anode via the metal wire 13, and an n-type electrode is connected to the lead part 12B used for a cathode via the metal wire 13.

The semiconductor element 10 may be any light emitting element and is not particularly limited. In the present embodiment, the semiconductor element 10 includes a seed layer made of AlN formed on a sapphire substrate, a base layer formed on the seed layer, and a laminated semiconductor layer mainly made of GaN. The semiconductor element 10 has, for example, a light emission wavelength region of 430 nm or more and 500 nm or less.

<Lead Frame>

The lead frame 12 is made of a material having excellent thermal conductivity and electrical conductivity, such as copper, and a silver plated layer is formed on a surface thereof by applying silver plating.

Therefore, at least a part of the silver plated layer on the lead parts 12A and 12B is exposed to the bottom surface of the recessed part of the resin container 15. The silver plated layer can be formed by using a publicly known silver plating method.

<Lead Part>

As shown in FIG. 3, in order to make the semiconductor light emitting device for a white light source correspond to surface mounting, the lead parts 12A and 12B have a structure of being bent to a back side of the resin container 15, and tip ends of the lead parts 12A and 12B are disposed on the back side of the resin container 15.

<Resin Container>

The resin container 15 is formed by molding a publicly known thermoplastic resin such as acrylic resin, polyvinyl chloride, polyphenylene sulfide, polyvinylidene chloride, polyamide, polycarbonate, polytetrafluoroethylene, polystyrene, polyurethane, ABS resin, liquid crystal polymer, polyacetal resin, or epoxy resin, or a thermosetting resin, in all of which a white pigment is blended, in a shape to hold the lead parts 12A and 12B. Among these resins, polyamide, liquid crystal polymer, epoxy resin, polystyrene, and nylon can be suitably used. In addition, the resin for forming the resin container 15 is blended with a white pigment, and the content, a particle size, and the like of the white pigment are adjusted such that a light reflectance of a visible light is 85% or more and 98% or less. Examples of the white pigment include, but are not limited to, zinc oxide, white lead, lithopone, titania (titanium oxide), aluminum oxide, precipitated barium sulfate, and a barite powder. In particular, titanium oxide can be suitably used from the viewpoint of a high refractive index and a low light absorptivity. Further, in order to efficiently use light emitted from the semiconductor element 10, silver plating may be applied to a surface of the recessed part.

<Phosphor Sealing Resin>

Examples of the phosphor-containing sealing resin 14 include, but are not limited to, a transparent resin in the visible region, such as silicone resin, epoxy resin, and acrylic resin. Among these resins, the silicone resin can be suitably used from the viewpoint of light resistance and heat resistance.

In particular, by blending the phosphor according to the present embodiment in the phosphor-containing sealing resin 14, the white light exhibits high color rendering properties including light emission in the short wavelength region of blue-green light.

That is, at least one kind of the phosphor according to the first embodiment may be contained in the phosphor-containing sealing resin 14. Further, a mixture of i) a nitride-based phosphor known as a $CaAlSiN_3$-based phosphor that emits light in a red region, ii) a sulfide-based phosphor, and iii) a YAG:Ce phosphor that is a yellow light emitting phosphor may be used additionally. In addition, it is possible to appropriately select the kind of the phosphor in order to adjust a light color to a desired emission light color.

The structure of the semiconductor light emitting device for a white light source is not limited to that described above, as long as light emitted from the semiconductor element 10 excites the phosphor according to the embodiment to obtain a white light exhibiting high color rendering.

Hereinafter, examples and comparative examples will be specifically described.

Examples 1 to 48 and Comparative Examples 1 to 23

In respect of Examples 1 to 48 and Comparative Examples 1 to 23, the raw materials were mixed in accordance with blending amounts shown in Table 2 of FIG. 6, Table 3 of FIG. 7, and Table 4 of FIG. 8, and were calcined to obtain a phosphor.

Hereinafter, Example 15 will be described as a representative example.

Example 15

(1) As raw materials, 185.56 g of a lutetium oxide ($Lu_2O_3$) powder, 1.34 g of a magnesium oxide powder (MgO), 84.97 g of an alumina ($Al_2O_3$) powder, 1.72 g of a cerium oxide ($CeO_2$) powder, and 3.18 g of a barium fluoride powder were weighed and put into one container. The barium fluoride was a flux. (2) These raw materials were thoroughly mixed. A device such as a ball mill can be used for mixing. (3) The mixture was put into an alumina crucible and calcined at 1400° C. for about 3 hours in an electric furnace at an atmospheric pressure.

In this way, a phosphor that can be represented by the chemical formula of $Lu_{(3-x-y-z)}Mg_xZn_yAl_5O_{12}:Ce_z$ can be obtained in which x is 0.1, y is 0, and z is 0.03.

Figure 2B:
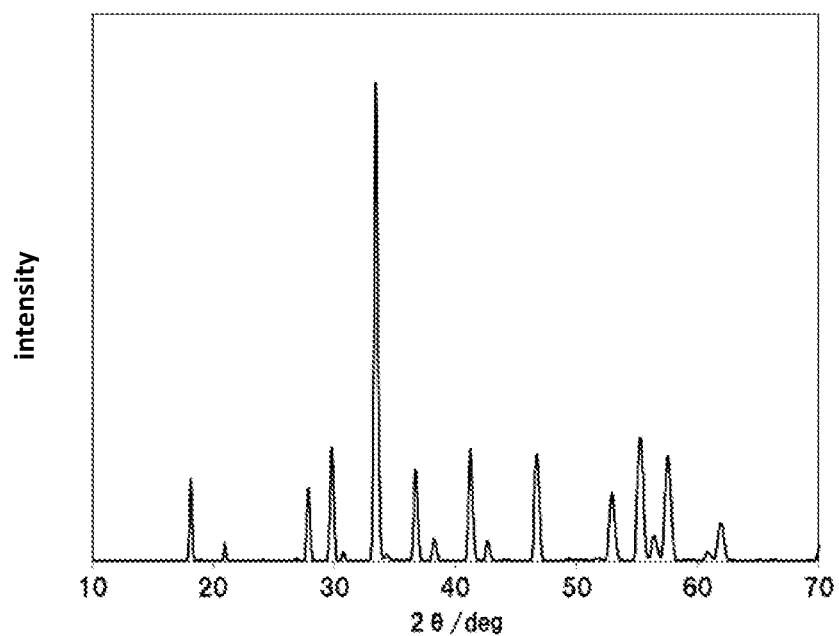
FIG. 2B illustrates a powder X-ray diffraction profile of a YAG:Ce phosphor.

A fluorescence spectrum of Example 15 which is obtained at the time of excitation with blue light of 450 nm is shown in FIG. 1, and a powder X-ray diffraction profile of a synthesized phosphor is shown in FIG. 2A. It can be seen from FIG. 1 that the phosphor in Example 15 has a peak wavelength smaller than 520 nm and has high-intensity light emission in a blue-green region. By comparing the X-ray diffraction profile in FIG. 2A with an X-ray diffraction profile of a publicly known phosphor YAG:Ce having a garnet structure in FIG. 2B, it can be seen that main peak positions in the X-ray diffraction profile in FIG. 2A coincide with those of the X-ray diffraction profile in FIG. 2B, but peak height ratios thereof are different, and that the phosphor in Example 15 has a crystal structure that is similar to the garnet structure but does not completely coincide therewith. Such a characteristic X-ray diffraction profile indicates distortion of the crystal structure from the garnet structure, which characterizes light emission properties in Example 15. Positions of main peaks and relative intensity of peak positions in the X-ray diffraction profiles according to FIGS. 2A and 2B are shown in Table 1 in FIG. 5.

According to Table 1 in FIG. 5, it can be seen that heights of a peak at 2θ of 28.0 degrees and a peak at 30.0 degrees in the X-ray diffraction profile of the phosphor in Example 15 are different from those of counterparts in a case of YAG:Ce, and that the phosphor has characteristics such as having a peak at a position of 53.2 degrees which is not seen in the case of YAG:Ce.

Examples 1 to 14, Examples 16 to 47 and Comparative Examples 1 to 23

Examples 1 to 14, 16 to 47 and Comparative Examples 1 to 23 are similar to Example 15, except that the raw materials were prepared in accordance with blending amounts shown in Table 2 of FIG. 6, Table 3 of FIG. 7, and Table 4 of FIG. 8 to produce the phosphor, and that values of x, y, and z in the chemical formula of $Lu_{(3-x-y-z)}Mg_xZn_yAl_5O_{12}:Ce_z$ which can represent the phosphor were shown in Table 2 of FIG. 6, Table 3 of FIG. 7, and Table 4 in FIG. 8.

The light emission properties in the blue-green region (500 nm to 520 nm) and external quantum efficiency retention ratios at a high temperature were evaluated for Examples 1 to 47 and Comparative Examples 1 to 23. Evaluation methods and determination criteria thereof will be described below.

(Light Emission Properties in Blue-Green Region (500 nm to 520 nm))

The fluorescence spectrum and external quantum efficiency of each of the synthesized phosphors in the examples and comparative examples were measured with a spectrofluorometer (hereinafter referred to as a spectrofluorometer) using an integrating sphere. A powder of the synthesized phosphor was put into an aluminum container having a diameter of 5 mm and a depth of 2 mm, and then the aluminum container was placed at a predetermined position in an integrating sphere. The powder was irradiated with blue light of 450 nm emitted from a blue LED light source attached to a measurement device to measure the fluorescence spectrum.

<Determination Criteria> (Light Emission Properties in Blue-Green Region (500 nm to 520 nm))

A determination result in a case where, in the fluorescence spectrum, a light emission peak wavelength was 500 nm or more and 520 nm or less and a value C obtained by dividing a light emission intensity at the light emission peak wavelength by a light emission intensity at 555 nm was 1.2 or more, was denoted by E indicating that the light emission properties of the phosphor were particularly excellent in the blue-green region. A determination result in a case where, in the fluorescence spectrum, the light emission peak wavelength was 500 nm or more and 520 nm or less and the value C obtained by dividing the light emission intensity at the light emission peak wavelength by the light emission intensity at 555 nm was less than 1.2, was denoted by G indicating that the light emission properties of the phosphor were excellent in the blue-green region. A determination result in a case where, in the fluorescence spectrum, the light emission peak wavelength was larger than 520 nm, was denoted by P indicating that the light emission properties of the phosphor were insufficient in the blue-green region.

(External Quantum Efficiency Retention Ratio at High Temperature)

The external quantum efficiency retention ratio at a high temperature, of each of the synthesized phosphors in the examples and comparative examples, was measured using the following method. The powder of the synthesized phosphor was put into an aluminum container having a diameter of 5 mm and a depth of 2 mm, and then the aluminum container was placed on a plate capable of heating the aluminum container. With the powder together with the aluminum container being heated to 150° C., the aluminum container was placed at a predetermined position in an integrating sphere, and the powder was irradiated with blue light of 450 nm emitted from a blue LED light source attached to a measurement device to measure the quantum efficiency. A measurement value was set as external quantum efficiency A at a high temperature. Next, a value of external quantum efficiency B at 25° C. was used without heating to 150° C., and A/B was set as an external quantum efficiency retention ratio at a high temperature.

(Determination Criteria)

A determination result was denoted by E in a case where A/B was 0.95 or more, that is, a range in which the external quantum efficiency retention ratio at a high temperature was particularly high; a determination result was denoted by G in a case where A/B was 0.9 or more and less than 0.95, that is, a range in which the external quantum efficiency retention ratio at a high temperature was high; and a determination result was denoted by P in a case where A/B was less than 0.9, that is, a range in which the external quantum efficiency retention ratio at a high temperature was low.

<Comprehensive Determination>

In respect of the light emission properties in the blue-green region and the external quantum efficiency retention ratio at a high temperature described above, a case where both were E was denoted by E indicating that the light emission properties in the blue-green region and the external quantum efficiency retention ratio at a high temperature are particularly excellent; a case where either was P was denoted by P indicating that the light emission properties in the blue-green region or the external quantum efficiency retention ratio at a high temperature is bad; and other cases were denoted by G indicating that the light emission properties in the blue-green region and the external quantum efficiency retention ratio at a high temperature are excellent.

The following can be known according to Examples 1 to 47 and Comparative Examples 1 to 23.

The following can be known according to examples 1 to 28.

It can be seen that, in respect of a phosphor which can be represented by a chemical formula of $Lu_{(3-x-y-z)}Mg_xZn_yAl_5O_{12}:Ce_z$, when z was in a range of $0.01 \leq z \leq 0.03$, and $0 \leq x \leq 1.4$ and $0 \leq y \leq 1.4$, excluding x=0 and y=0, the phosphor was excellent in the light emission properties in the blue-green region and the external quantum efficiency retention ratio at a high temperature. It can be seen that, particularly in a range of y<0.2 and $0.1 \leq x \leq 1.4$, or in a range of x<0.2 and $0.1 \leq y \leq 1.4$, the phosphor was particularly excellent in the light emission properties in the blue-green region and the external quantum efficiency retention ratio at a high temperature.

The following can be known according to Examples 29 to 37 and Comparative Examples 1 to 5.

It can be seen that, in respect of a phosphor which can be represented by a chemical formula of $Lu_{(3-x-y-z)}Mg_xZn_yAl_5O_{12}:Ce_z$, when z was in a range of $0.03 < z \leq 0.06$, and $y \leq 0.2$ and $0.1 \leq x \leq 1.4$, or $x \leq 0.2$ and $0.1 \leq y \leq 1.4$, or x=0.2 and y=0.2, the phosphor was excellent in the light emission properties in the blue-green region and the external quantum efficiency retention ratio at a high temperature. It can be seen that, particularly in a range of y<0.2 and 0.1<x<0.9, or in a range of x<0.2 and 0.1<y<0.9, the phosphor was particularly excellent in the light emission properties in the blue-green region and the external quantum efficiency retention ratio at a high temperature.

The following can be known according to Examples 38 to 43 and Comparative Examples 6 to 13.

It can be seen that, in respect of a phosphor which can be represented by a chemical formula of $Lu_{(3-x-y-z)}Mg_xZn_yAl_5O_{12}:Ce_z$, when z was in a range of $0.06 < z \leq 0.09$, and y<0.2 and 0.1≤x<1.4, or x<0.2 and 0.1≤y<1.4, the phosphor was excellent in the light emission properties in the blue-green region and the external quantum efficiency retention ratio at a high temperature.

The following can be known according to Examples 44 to 47 and Comparative Examples 14 to 23.

It can be seen that, in respect of a phosphor which can be represented by a chemical formula of $Lu_{(3-x-y-z)}Mg_xZn_yAl_5O_{12}:Ce_z$, when z was in a range of $0.09 < z \leq 0.12$, and y<0.2 and 0.1≤x<0.9, or x<0.2 and 0.1≤y<0.9, the phosphor was excellent in the light emission properties in the blue-green region and the external quantum efficiency retention ratio at a high temperature.

Example 48

Example 48 is an example of a semiconductor light emitting device for a white light source which includes the phosphor according to the present example.

A production process of the semiconductor light emitting device for a white light source is not limited, and, for example, a method as to be described below can be used. The phosphor and a production method thereof may be the similar to Example 15.

Figure 4A:
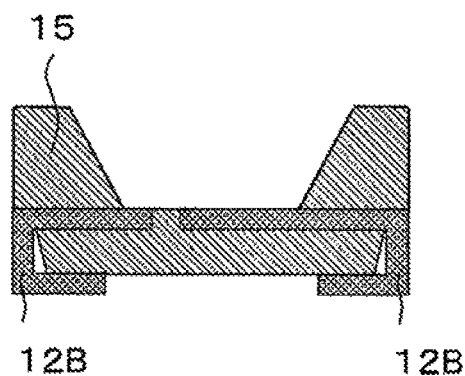
FIG. 4A is a schematic cross-sectional view illustrating one step of a method for producing the example (for example, Example 48) of the semiconductor light emitting device for a white light source which uses the phosphor according to the first embodiment.
Figure 4B:
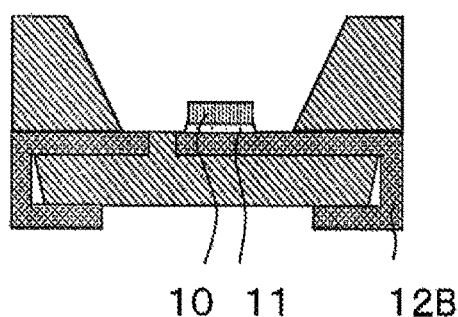
FIG. 4B is a schematic cross-sectional view illustrating one step of the method for producing the example (for example, Example 48) of the semiconductor light emitting device for a white light source which uses the phosphor according to the first embodiment.
Figure 4C:
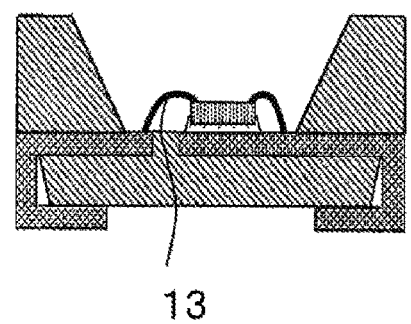
FIG. 4C is a schematic cross-sectional view illustrating one step of the method for producing the example (for example, Example 48) of the semiconductor light emitting device for a white light source which uses the phosphor according to the first embodiment.
Figure 4D:
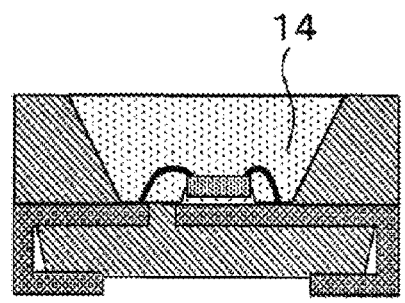
FIG. 4D is a schematic cross-sectional view illustrating one step of the method for producing the example (for example, Example 48) of the semiconductor light emitting device for a white light source which uses the phosphor according to the first embodiment.

FIGS. 4A to 4D are cross-sectional views illustrating steps of an assembly process of the semiconductor light emitting device for a white light source according to Example 48. The production method will be described specifically below. (1) Production of Phosphor Production of the phosphor is similar to that of Example 15. (2) Assembly of Members a) First, as shown in FIG. 4A, by injection molding of a white resin, the resin container 15, in which a copper lead frame was disposed in a recessed part thereof, was formed integrally with the silver plated lead part 12B of the lead frame. As the white resin, a titanium oxide-containing polycarbonate was used.

b) Next, as shown in FIG. 4B, on the lead frame on a bottom surface of the recessed part of the resin container 15, the semiconductor element 10 was mounted, via the publicly known paste material 11, on the lead part 12B used for a cathode, through die bonding and subsequent curing of the paste material according to a publicly known method.

c) Further, as shown in FIG. 4C, a p-type electrode and an n-type electrode of the semiconductor element 10 were connected to the corresponding lead part 12A used for an anode and lead part 12B used for the cathode respectively by using the metal wire 13 with a publicly known wire bonding method.

d) Next, as shown in FIG. 4D, a mixture of i) an uncured silicone resin monomer and ii) a mixed powder of the phosphor produced as above, a YAG:Ce phosphor and a $CaAlSiN_3$-based phosphor was filled in an appropriate amount by a dispenser into the recessed part of the resin container 15. Thereafter, the mixture was cured through heating to form the phosphor-containing sealing resin 14.

According to the above production process, the semiconductor light emitting device for a white light source in Example 48, which has excellent color rendering properties and a high retention ratio of light emission intensity at a high temperature, can be obtained.

It should be noted that appropriate combinations of any of the embodiments and/or examples among the various embodiments and/or examples described above are within the scope of the present disclosure, and effects of the respective embodiments and/or examples can be achieved.

Second Embodiment

A phosphor according to the present disclosure is represented by a chemical formula of $Lu_{(3-z)}Mg_xZn_yAl_{(5-x-y)}O_{12}:Ce_z$, in which when z is in a range of $0.01 \leq z \leq 0.03$, then $0 \leq x \leq 1.4$ and $0 \leq y \leq 1.4$, excluding x=0 and y=0;

when z is in a range of $0.03 < z \leq 0.06$, then $y < 0.2$ and $0.1 \leq x \leq 1.4$, or $x < 0.2$ and $0.1 \leq y \leq 1.4$, or x=0.2 and y=0.2;

when z is in a range of $0.06 < z \leq 0.09$, then $y < 0.2$ and $0.1 \leq x < 1.4$, or $x < 0.2$ and $0.1 \leq y < 1.4$; and when z is in a range of $0.09 < z \leq 0.12$, then $y < 0.2$ and $0.1 \leq x < 0.9$, or $x < 0.2$ and $0.1 \leq y < 0.9$.

In respect of the phosphor according to the present disclosure, when z is in a range of $0.01 \leq z \leq 0.03$, then $y < 0.2$ and $0.1 \leq x \leq 1.4$, or $x < 0.2$ and $0.1 \leq y \leq 1.4$; and when z is in a range of $0.03 < z \leq 0.06$, then $y < 0.2$ and $0.1 < x < 0.9$, or $x < 0.2$ and $0.1 < y < 0.9$.

The semiconductor light emitting device for a white light source according to the present disclosure includes the phosphor described above, and a semiconductor light emitting device having a light emission peak wavelength of 450 nm.

With the configuration described above, it is possible to provide an efficient semiconductor light emitting device for a white light source with excellent color rendering properties and low luminance decrease at high output for having low luminance decrease at a high temperature.

<Phosphor>

Figure 9:
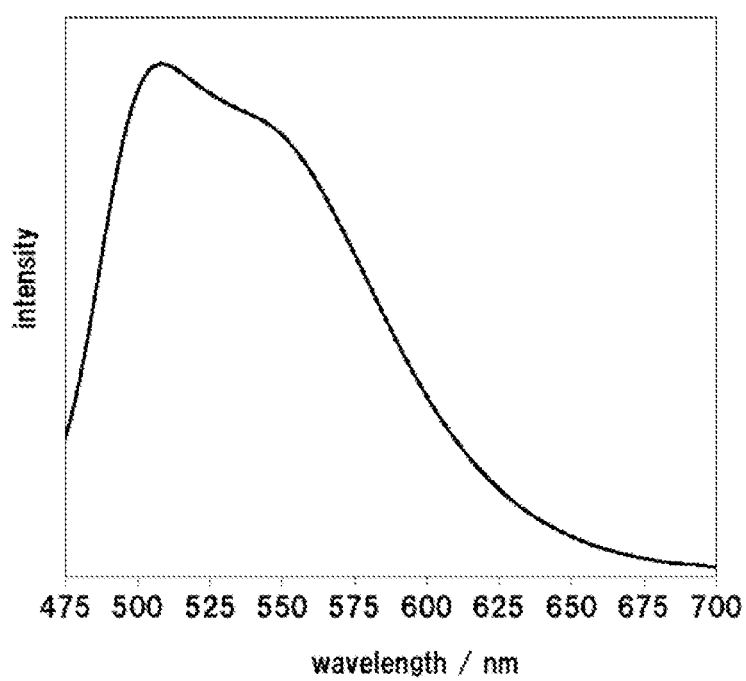
FIG. 9 illustrates a fluorescence spectrum of an example (for example, Example 1015) of a phosphor according to a second embodiment.
Figure 10A:
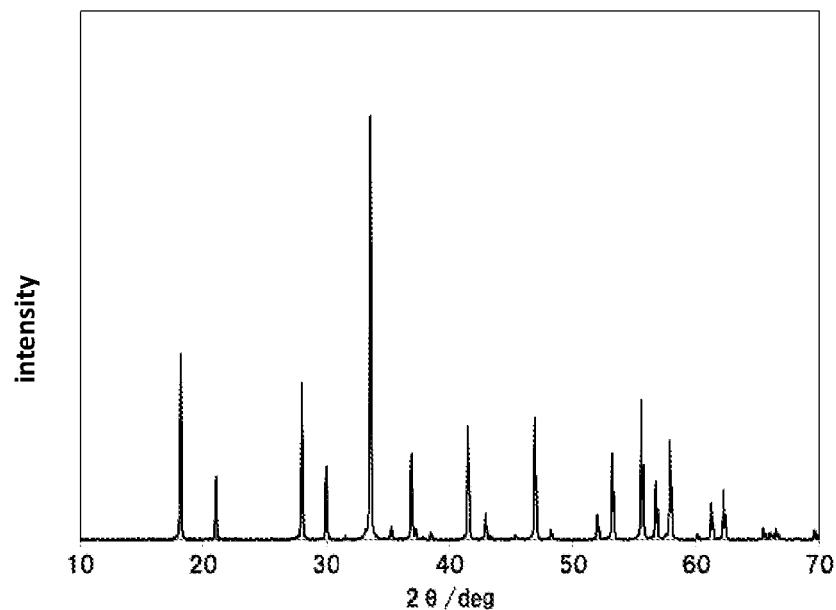
FIG. 10A is a diagram illustrating a powder X-ray diffraction profile of the example (for example, Example 1015) of the phosphor according to the second embodiment.

FIG. 9 illustrates a fluorescence spectrum of an example (for example, Example 1015) of the phosphor according to the second embodiment. FIG. 10A illustrates a powder X-ray diffraction profile of the example (for example, Example 1015) of the phosphor according to the second embodiment.

The phosphor according to the second embodiment is represented by a chemical formula of $Lu_{(3-z)}Mg_xZn_yAl_5O_{12}$:$Ce_z$. The phosphor contains $Lu_3Al_5O_{12}$ as a matrix crystal which has a garnet structure, contains Mg or Zn as a metal element that substitutes a part of Al, and contains Ce as a light emission center element that substitutes a part of Lu. The contents of Mg, Zn, and Ce are respectively indicated by indices x, y, and z. Ranges of each index are shown for the following four cases, with respect to ranges of the index z indicating the content of Ce.

i) When z is in a range of $0.01 \leq z \leq 0.03$, then $0 \leq x \leq 1.4$ and $0 \leq y \leq 1.4$, excluding x=0 and y=0.

ii) When z is in a range of $0.03 < z \leq 0.06$, then $y < 0.2$ and $0.1 \leq x \leq 1.4$, or $x < 0.2$ and $0.1 \leq y \leq 1.4$, or x=0.2 and y=0.2.

iii) When z is in a range of $0.06 < z \leq 0.09$, then $y < 0.2$ and $0.1 \leq x < 1.4$, or $x < 0.2$ and $0.1 \leq y < 1.4$.

iv) When z is a range of $0.09 < z \leq 0.12$, then $y < 0.2$ and $0.1 \leq x < 0.9$, or $x < 0.2$ and $0.1 \leq y < 0.9$.

As illustrated in the fluorescence spectrum of FIG. 9, the phosphor has a light emission peak wavelength of 500 nm or more and 520 nm or less, exhibits high color rendering properties in a short wavelength region within a visible wavelength region, and shows low decrease in light emission luminance or light emission luminance at a high temperature. Therefore, it is possible to obtain an excellent semiconductor light emitting device for a white light source with high color rendering and low luminance decrease at a high temperature by combining the phosphor with, for example, a semiconductor light emitting device that emits blue light and has a light emission peak wavelength of 450 nm.

<Method for Producing Phosphor>

Hereinafter, each step of a method for producing the phosphor according to the second embodiment will be described. (1) As raw materials, oxides, for example, of lutetium (Lu), aluminum (Al), magnesium (Mg), and zinc (Zn), which are elements constituting a matrix crystal, can be used. As the oxides of the raw materials, lutetium oxide, alumina, magnesium oxide, and zinc oxide are prepared, and further cerium oxide is prepared as a raw material of cerium (Ce) serving as an activator. It should be noted that at least one of magnesium oxide and zinc oxide may be prepared, or both may be prepared. In addition, the raw materials can also be metal salt compounds including carbonates and the like, instead of the oxides. (2) Predetermined amounts of powders of the raw materials are weighed and thoroughly mixed. For example, a mixing device such as a ball mill can be used for mixing the powders, or the powders can be mixed manually using a mortar or the like. Barium fluoride ($BaF_2$) or strontium fluoride ($SrF_2$) as a flux corresponding to 0.1 weight % to 10 weight % of the mixed powder can be mixed.

Although the mixed powder is obtained by dry mixing as described above, the mixing is not limited thereto, and may be wet mixing. Further, the mixed powder of the raw materials may be obtained by a precipitation reaction, a sol-gel method, or the like.

(3) Next, the mixed powder prepared as described above is calcined. For example, an electric furnace can be used for calcining the mixed powder. The mixed powder is put into, for example, a crucible made of alumina, and is heated together with the alumina crucible at 1200° C. or higher and 1600° C. or lower for about 3 hours or more and 12 hours or less for calcining. (4) After the calcining, the mixed powder is subjected to steps such as cooling, crushing, or fluxing with an acid as required to obtain the phosphor powder.

<Semiconductor Light Emitting Device for White Light Source>

Figure 11:
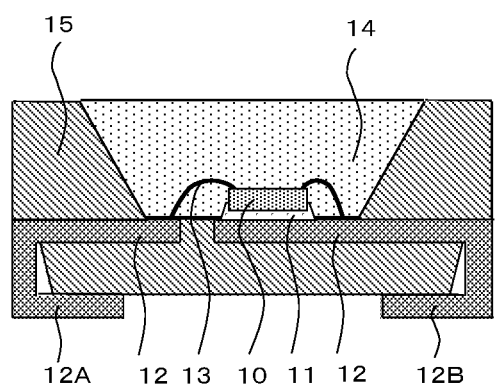
FIG. 11 is a cross-sectional view illustrating an example (for example, Example 1048) of a semiconductor light emitting device for a white light source which uses the phosphor according to the second embodiment.

FIG. 11 is a schematic cross-sectional view illustrating a structure of a semiconductor light emitting device 20 for a white light source according to the second embodiment. The semiconductor light emitting device 20 for a white light source includes: the lead frame 12 that at least includes the lead parts 12A and 12B; the resin container 15 that includes a recessed part; the semiconductor element 10 that is disposed on an inner side of the resin container 15 and that is mounted on the lead part 12B via the publicly known die bonding material 11; the metal wire 13 that electrically connects the semiconductor element 10 and the lead parts 12A and 12B; and the phosphor-containing sealing resin 14.

Hereinafter, members constituting the semiconductor light emitting device 20 for a white light source will be described.

<Semiconductor Element (Semiconductor Light Emitting Device)>

The semiconductor element 10 is bonded by the paste material 11 so as to be mounted on the lead part 12B at a portion located on a bottom surface of the recessed part of the resin container 15. Further, a p-type electrode is connected to the lead part 12A used for an anode via the metal wire 13, and an n-type electrode is connected to the lead part 12B used for a cathode via the metal wire 13.

The semiconductor element 10 may be any light emitting element and is not particularly limited. In the present embodiment, for example, the semiconductor element 10 includes a seed layer made of AlN formed on a sapphire substrate, a base layer formed on the seed layer, and a laminated semiconductor layer mainly made of GaN. The semiconductor element 10 has, for example, a light emission wavelength region of 430 nm or more and 500 nm or less.

<Lead Frame>

The lead frame 12 is made of a material having excellent thermal conductivity and electrical conductivity, such as copper, and a silver plated layer is formed on a surface thereof by applying silver plating. Therefore, at least part of the silver plated layer on the lead parts 12A and 12B is exposed to the bottom surface of the recessed part of the resin container 15. The silver plated layer can be formed by using a publicly known silver plating method.

<Lead Part>

As shown in FIG. 11, in order to make the semiconductor light emitting device for a white light source correspond to surface mounting, the lead parts 12A and 12B have a structure of being bent to a back side of the resin container 15, and tip ends of the lead parts 12A and 12B are disposed on the back side of the resin container 15.

<Resin Container>

The resin container 15 is formed by molding a publicly known thermoplastic resin such as acrylic resin, polyvinyl chloride, polyphenylene sulfide, polyvinylidene chloride, polyamide, polycarbonate, polytetrafluoroethylene, polystyrene, polyurethane, ABS resin, liquid crystal polymer, polyacetal resin, or epoxy resin, or a thermosetting resin, in all of which a white pigment is blended, in a shape to hold the lead parts 12A and 12B. Among those resins, polyamide, liquid crystal polymer, epoxy resin, polystyrene, and nylon can be suitably used. In addition, the resin for forming the resin container 15 is blended with a white pigment, and the content, a particle size, and the like of the white pigment are adjusted such that a light reflectance of a visible light is 85% or more and 98% or less. Examples of the white pigment include, but are not limited to, zinc oxide, white lead, lithopone, titania (titanium oxide), aluminum oxide, precipitated barium sulfate, and a barite powder. In particular, titanium oxide can be suitably used from the viewpoint of a high refractive index and a low light absorptivity. Further, in order to efficiently use light emitted from the semiconductor element 10, silver plating may be applied to a surface of the recessed part.

<Phosphor Sealing Resin>

Examples of the phosphor-containing sealing resin 14 include, but are not limited to, a transparent resin in the visible region, such as silicone resin, epoxy resin, and acrylic resin. Among these resins, the silicone resin can be suitably used from the viewpoint of light resistance and heat resistance.

In particular, by blending the phosphor according to the present embodiment in the phosphor-containing sealing resin 14, the white light exhibits high color rendering properties including light emission in the short wavelength region of blue-green light.

That is, at least one kind of the phosphor according to the second embodiment may be contained in the phosphor-containing sealing resin 14. Further, a mixture of i) a nitride-based phosphor known as a $CaAlSiN_3$-based phosphor that emits light in a red region, ii) a sulfide-based phosphor, and iii) a YAG:Ce phosphor that is a yellow light emitting phosphor may be used additionally. In addition, it is possible to appropriately select the kind of the phosphor in order to adjust a light color to a desired emission light color.

The structure of the semiconductor light emitting device for a white light source is not limited to that described above, as long as light emitted from the semiconductor element 10 excites the phosphor according to the embodiment to obtain a white light exhibiting high color rendering properties.

Hereinafter, examples and comparative examples will be specifically described.

Examples 101 to 1048 and Comparative Examples 101 to 1023

In respect of Examples 101 to 1048 and Comparative Examples 101 to 1023, the raw materials were mixed in accordance with blending amounts shown in Table 6 of FIG. 14, Table 7 of FIG. 15, and Table 8 of FIG. 16, and were calcined to obtain a phosphor.

Hereinafter, Example 1015 will be described as a representative example.

Example 1015

(1) As raw materials, 192.03 g of a lutetium oxide ($Lu_2O_3$) powder, 1.34 g of a magnesium oxide (MgO) powder, 83.3 g of an alumina ($Al_2O_3$) powder, 1.72 g of a cerium oxide ($CeO_2$) powder, and 3.23 g of a barium fluoride powder were weighed and put into one container. The barium fluoride was a flux. (2) These raw materials were thoroughly mixed. A device such as a ball mill can be used for mixing. (3) The mixture was put into a carbon crucible and calcined in an electric furnace at 1400° C. for about 3 hours in a nitrogen atmosphere.

In this way, a phosphor that can be represented by the chemical formula of $Lu_{(3-z)}Mg_xZn_yAl_{(5-x-y)}O_{12}:Ce_z$ can be obtained in which x is 0.1, y is 0, and z is 0.03.

Figure 10B:
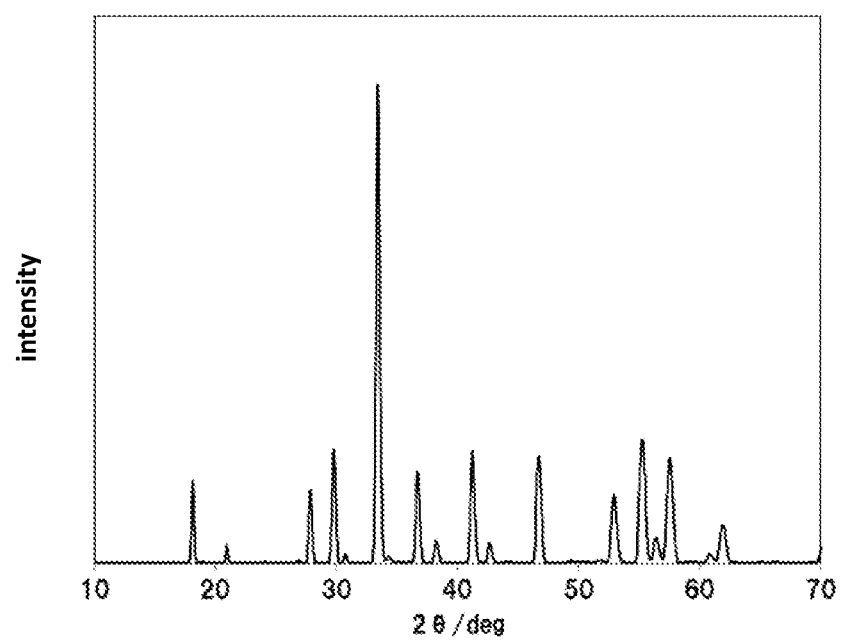
FIG. 10B illustrates a powder X-ray diffraction profile of a YAG:Ce phosphor.

A fluorescence spectrum of Example 1015 which is obtained at the time of excitation with blue light of 450 nm is shown in FIG. 9, and a powder X-ray diffraction profile of a synthesized phosphor is shown in FIG. 10A. It can be seen from FIG. 9 that the phosphor in Example 1015 has a peak wavelength smaller than 520 nm and has high-intensity light emission in a blue-green region. By comparing the X-ray diffraction profile in FIG. 10A with an X-ray diffraction profile, shown in FIG. 10B, of a publicly known phosphor YAG:Ce having a garnet structure, it can be seen that main peak positions in the X-ray diffraction profile in FIG. 10A coincide with those of the X-ray diffraction profile in FIG. 10B, but peak height ratios are different, and that the phosphor in Example 1015 has a crystal structure that is similar to the garnet structure but does not completely coincide therewith. Such a characteristic X-ray diffraction profile indicates distortion of the crystal structure from the garnet structure, which characterizes light emission properties in Example 1015. Positions of main peaks and relative intensity of peak positions in the X-ray diffraction profiles according to FIGS. 10A and 10B are shown in Table 5 in FIG. 13.

According to Table 5 of FIG. 13, it can be seen that heights of a peak at 2θ of 28.1 degrees and a peak at 30.0 degrees in the X-ray diffraction profile of the phosphor in Example 1015 are different from heights of a peak at 2θ of 27.8 degrees and a peak at 29.8 degrees in a case of YAG:Ce, although there is a small difference in the peak position due to measurement error, and that the phosphor has characteristics such as having a peak at 53.3 degrees which is not seen in the case of YAG: Ce.

Examples 101 to 1014, Examples 1016 to 1047, and Comparative Examples 101 to 1023

Examples 101 to 1014, 1016 to 1047 and Comparative Examples 101 to 1023 are similar to Example 1015, except that the raw materials were prepared in accordance with blending amounts shown in Table 6 of FIG. 14, Table 7 of FIG. 15, and Table 8 of FIG. 16 to produce the phosphor, and that values of x, y, and z of the chemical formula of $Lu_{(3-z)}Mg_xZn_yAl_{(5-x-y)}O_{12}:Ce_z$ which can represent the phosphor were shown in Table 6 of FIG. 14, Table 7 of FIG. 15, and Table 8 in FIG. 16.

The light emission properties in the blue-green region (500 nm to 520 nm) and external quantum efficiency retention ratios at a high temperature were evaluated for Examples 101 to 1047 and Comparative Examples 101 to 1027. Evaluation methods and determination criteria thereof are described below.

(Light Emission Properties in Blue-Green Region (500 nm to 520 nm))

The fluorescence spectrum and external quantum efficiency of each of the synthesized phosphors in the examples and comparative examples were measured with a spectrofluorometer (hereinafter referred to as a spectrofluorometer) using an integrating sphere. A powder of the synthesized phosphor was put into an aluminum container having a diameter of 5 mm and a depth of 2 mm, and then the aluminum container was placed at a predetermined position in an integrating sphere. The powder was irradiated with blue light of 450 nm emitted from a blue LED light source attached to a measurement device to measure the fluorescence spectrum.

<Determination Criteria> (Light Emission Properties in Blue-Green Region (500 nm to 520 nm))

A determination result in a case where, in the fluorescence spectrum, a light emission peak wavelength was 500 nm or more and 520 nm or less and a value C obtained by dividing a light emission intensity at the light emission peak wavelength by a light emission intensity at 555 nm was 1.2 or more, was denoted by E indicating that the light emission properties of the phosphor were particularly excellent in the blue-green region. A determination result in a case where, in the fluorescence spectrum, the light emission peak wavelength was 500 nm or more and 520 nm or less and the value C obtained by dividing the light emission intensity at the light emission peak wavelength by the light emission intensity at 555 nm was less than 1.2, was denoted by G indicating that the light emission properties of the phosphor were excellent in the blue-green region. A determination result in a case where, in the fluorescence spectrum, the light emission peak wavelength was larger than 520 nm, was denoted by P indicating that the light emission properties of the phosphor were insufficient in the blue-green region.

(External Quantum Efficiency Retention Ratio at High Temperature)

The external quantum efficiency retention ratio at a high temperature, of each of the synthesized phosphors in the examples and comparative examples, was measured using the following method. The powder of the synthesized phosphor was put into an aluminum container having a diameter of 5 mm and a depth of 2 mm, and then the aluminum container was placed on a plate capable of heating the aluminum container. With the powder together with the aluminum container being heated to 150° C., the aluminum container was placed at a predetermined position in an integrating sphere, and the powder was irradiated with blue light of 450 nm emitted from a blue LED light source attached to a measurement device to measure the quantum efficiency. A measurement value was set as external quantum efficiency A at a high temperature. Next, a value of external quantum efficiency B at 25° C. was used without heating to 150° C., and A/B was set as an external quantum efficiency retention ratio at a high temperature.

(Determination Criteria)

A determination result was denoted by E in a case where A/B was 0.95 or more, that is, a range in which the external quantum efficiency retention ratio at a high temperature was particularly high; a determination result was denoted by G in a case where A/B was 0.9 or more and less than 0.95, that is, a range in which the external quantum efficiency retention ratio at a high temperature was high; and a determination result was denoted by P in a case where A/B was less than 0.9, that is, a range in which the external quantum efficiency retention ratio at a high temperature was low.

<Comprehensive Determination>

In respect of the light emission properties in the blue-green region and the external quantum efficiency retention ratio at a high temperature described above, a determination result in a case where both were E was denoted by E indicating that the light emission properties in the blue-green region and the external quantum efficiency retention ratio at a high temperature were particularly excellent; a determination result in a case where either was P was denoted by P indicating that the light emission properties in the blue-green region or the external quantum efficiency retention ratio at a high temperature was bad; and other cases were denoted by G indicating that the light emission properties in the blue-green region and the external quantum efficiency retention ratio at a high temperature were excellent.

The following can be known according to Examples 101 to 1047 and Comparative Examples 101 to 1027.

The following can be known according to Examples 101 to 1028.

It can be seen that, in respect of a phosphor which can be represented by a chemical formula of $Lu_{(3-z)}Mg_xZn_yAl_{(5-x-y)}O_{12}:Ce_x$, when z was in a range of $0.01 \leq z \leq 0.03$, and $0 \leq x \leq 1.4$ and $0 \leq y \leq 1.4$, excluding x=0 and y=0, the phosphor was excellent in the light emission properties in the blue-green region and the external quantum efficiency retention ratio at a high temperature. It can be known that, particularly in a range of y<0.2 and $0.1 \leq x \leq 1.4$, or in a range of x<0.2 and $0.1 \leq y \leq 1.4$, the phosphor was particularly excellent in the light emission properties in the blue-green region and the external quantum efficiency retention ratio at a high temperature.

The following can be known according to Examples 1029 to 1037 and Comparative Examples 101 to 105.

It can be seen that, in respect of a phosphor which can be represented by a chemical formula of $Lu_{(3-z)}Mg_xZn_yAl_{(5-x-y)}O_{12}:Ce_z$, when z was in a range of $0.03 < z \leq 0.06$, and y<0.2 and $0.1 \leq x \leq 1.4$, or x<0.2 and $0.1 \leq y \leq 1.4$, or x=0.2 and y=0.2, the phosphor was excellent in the light emission properties in the blue-green region and the external quantum efficiency retention ratio at a high temperature. It can be seen that, particularly in a range of y<0.2 and 0.1<x<0.9, or in a range of x<0.2 and 0.1<y<0.9, the phosphor was particularly excellent in the light emission properties in the blue-green region and the external quantum efficiency retention ratio at a high temperature.

The following can be known according to Examples 1038 to 1043 and Comparative Examples 106 to 1013.

It can be seen that, in respect of a phosphor which can be represented by a chemical formula of $Lu_{(3-z)}Mg_xZn_yAl_{(5-x-y)}O_{12}:Ce_z$, when z was in a range of $0.06 < z \leq 0.09$, and y<0.2 and $0.1 \leq x < 1.4$, or x<0.2 and $0.1 \leq y < 1.4$, the phosphor was excellent in the light emission properties in the blue-green region and the external quantum efficiency retention ratio at a high temperature.

The following can be known according to Examples 1044 to 1047 and Comparative Examples 1014 to 1023.

It can be seen that, in respect of a phosphor which can be represented by a chemical formula of $Lu_{(3-z)}Mg_xZn_yAl_{(5-x-y)}O_{12}:Ce_z$, when z was in a range of $0.09<z\leq0.12$, and $y<0.2$ and $0.1\leq x<0.9$, or $x<0.2$ and $0.1\leq y<0.9$, the phosphor was excellent in the light emission properties in the blue-green region and the external quantum efficiency retention ratio at a high temperature.

Example 1048

Example 1048 is an example of a semiconductor light emitting device for a white light source which includes the phosphor according to the present example.

A production process of the semiconductor light emitting device for a white light source is not limited, and, for example, a method as to be described below can be used. The phosphor and a production method thereof may be similar to in Example 1015.

FIGS. 12A to 12D are cross-sectional views illustrating steps of an assembly process of the semiconductor light emitting device 20 for a white light source according to Example 1048.

Figure 12A:
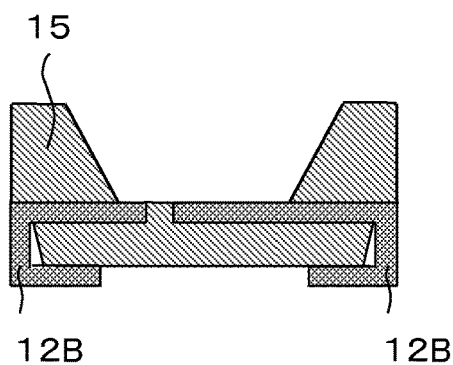
FIG. 12A is a cross-sectional view illustrating one step of a method for producing the example (for example, Example 1048) of the semiconductor light emitting device for a white light source which uses the phosphor according to the second embodiment.
Figure 12B:
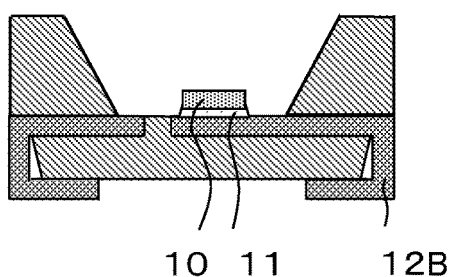
FIG. 12B is a cross-sectional view illustrating one step of the method for producing the example (for example, Example 1048) of the semiconductor light emitting device for a white light source which uses the phosphor according to the second embodiment.
Figure 12C:
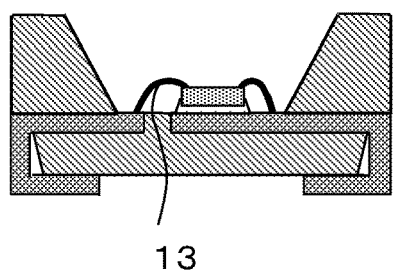
FIG. 12C is a cross-sectional view illustrating one step of the method for producing the example (for example, Example 1048) of the semiconductor light emitting device for a white light source which uses the phosphor according to the second embodiment.
Figure 12D:
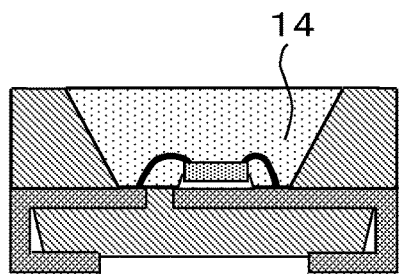
FIG. 12D is a cross-sectional view illustrating one step of the method for producing the example (for example, Example 1048) of the semiconductor light emitting device for a white light source which uses the phosphor according to the second embodiment.

The production method will be described specifically below. (1) Production of Phosphor Production of the phosphor is similar to that of Example 1015. (2) Assembly of Members a) First, as shown in FIG. 12A, by injection molding of a white resin, the resin container 15, in which a copper lead frame was disposed in a recessed part thereof, was formed integrally with the silver plated lead part 12B of the lead frame. As the white resin, a titanium oxide-containing polycarbonate was used.

b) Next, as shown in FIG. 12B, on the lead frame on a bottom surface of the recessed part of the resin container 15, the semiconductor element 10 was mounted, via the publicly known paste material 11, on the lead part 12B used for a cathode, through die bonding and subsequent curing of the paste material according to a publicly known method.

c) Further, as shown in FIG. 12C, a p-type electrode and an n-type electrode of the semiconductor element 10 were connected to the corresponding lead part 12A used for an anode and lead part 12B used for the cathode respectively by using the metal wire 13 with a publicly known wire bonding method.

d) Next, as shown in FIG. 12D, a mixture of i) an uncured silicone resin monomer and ii) a mixed powder of the phosphor produced as above, a YAG:Ce phosphor and a $CaAlSiN_3$-based phosphor was filled in an appropriate amount by a dispenser into the recessed part of the resin container 15. Thereafter, the mixture was cured through heating to form the phosphor-containing sealing resin 14.

According to the above production process, the semiconductor light emitting device for a white light source in Example 1048, which has excellent color rendering properties and a high retention ratio of light emission intensity at a high temperature, can be obtained.

It should be noted that appropriate combinations of any of the embodiments and/or examples among the various embodiments and/or examples described above are within the scope of the present disclosure, and effects of the respective embodiments and/or examples can be achieved.

The phosphor according to the present disclosure has a light emission peak wavelength in a range of 500 nm or more and 520 nm or less, has a large light emission amount in the blue-green region, and show low decrease in light emission amount in a high-temperature environment. Therefore, when the phosphor is applied to a semiconductor light emitting device that emits blue light, a semiconductor light emitting device for a white light source which has excellent color rendering properties can be obtained. The semiconductor light emitting device for a white light source can be suitably used as a light source for illumination or a light source for liquid crystal backlight, and has high industrial utility value.

What is claimed is:

1. A phosphor represented by a chemical formula of $Lu_{(3-x-y-z)}Mg_xZn_yAl_5O_{12}:Ce_z$, wherein when z is in a range of $0.01\leq z\leq0.03$, then $0\leq x\leq1.4$ and $0\leq y\leq1.4$, excluding $x=0$ and $y=0$;

when z is in a range of $0.03<z\leq0.06$, then $y<0.2$ and $0.1\leq x\leq1.4$, or $x<0.2$ and $0.1\leq y\leq1.4$, or $x=0.2$ and $y=0.2$;

when z is in a range of $0.06<z\leq0.09$, then $y<0.2$ and $0.1\leq x<1.4$, or $x<0.2$ and $0.1\leq y<1.4$; and when z is in a range of $0.09<z\leq0.12$, then $y<0.2$ and $0.1\leq x<0.9$ or $x<0.2$ and $0.1\leq y<0.9$.

2. The phosphor according to claim 1, wherein in the chemical formula, when z is in a range of $0.01\leq z\leq0.03$, then $y<0.2$ and $0.1\leq x\leq1.4$, or $x<0.2$ and $0.1\leq y\leq1.4$, and when z is in a range of $0.03<z\leq0.06$, then $y<0.2$ and $0.1<x<0.9$, or $x<0.2$ and $0.1<y<0.9$.

3. A semiconductor light emitting device for a white light source, comprising:

the phosphor according to claim 1; and a semiconductor light emitting device having a light emission peak wavelength of 450 nm.

4. A phosphor represented by a chemical formula of $Lu_{(3-z)}Mg_xZn_yAl_{(5-x-y)}O_{12}:Ce_z$, wherein when z is in a range of $0.01\leq z\leq0.03$, then $0\leq x\leq1.4$ and $0\leq y\leq1.4$, excluding $x=0$ and $y=0$;

when z is in a range of $0.03<z\leq0.06$, then $y<0.2$ and $0.1\leq x\leq1.4$, or $x<0.2$ and $0.1\leq y\leq1.4$, or $x=0.2$ and $y=0.2$;

when z is in a range of $0.06<z\leq0.09$, then $y<0.2$ and $0.1\leq x<1.4$, or $x<0.2$ and $0.1\leq y<1.4$; and when z is in a range of $0.09<z\leq0.12$, then $y<0.2$ and $0.1\leq x<0.9$, or $x<0.2$ and $0.1\leq y<0.9$.

5. The phosphor according to claim 4, wherein when z is in a range of $0.01\leq z\leq0.03$, then $y<0.2$ and $0.1\leq x\leq1.4$, or $x<0.2$ and $0.1\leq y\leq1.4$, and when z is in a range of $0.03<z\leq0.06$, then $y<0.2$ and $0.1<x<0.9$, or $x<0.2$ and $0.1<y<0.9$.

6. A semiconductor light emitting device for a white light source, comprising:

the phosphor according to claim 4; and a semiconductor light emitting device having a light emission peak wavelength of 450 nm.

* * * * *